United States Patent [19]
Kanno

[11] Patent Number: 6,031,410
[45] Date of Patent: Feb. 29, 2000

[54] MULTIPLEXOR COMPOSED OF DYNAMIC LATCHES

[75] Inventor: Hiroshi Kanno, Tokyo, Japan

[73] Assignee: NEC Corporation, Tokyo, Japan

[21] Appl. No.: 09/058,964

[22] Filed: Apr. 13, 1998

[30] Foreign Application Priority Data

Apr. 11, 1997 [JP] Japan ..................................... 9-110326

[51] Int. Cl.[7] .......................... H03K 17/62; H03K 3/037
[52] U.S. Cl. ........................... 327/407; 327/99; 327/200; 365/189.02; 365/189.05
[58] Field of Search .................................... 327/200, 407, 327/99, 201, 408, 409; 365/189.02, 189.05

[56] References Cited

U.S. PATENT DOCUMENTS

| | | | |
|---|---|---|---|
| 5,254,888 | 10/1993 | Lee et al. ................................. | 327/152 |
| 5,576,651 | 11/1996 | Phillips ................................... | 327/202 |
| 5,619,157 | 4/1997 | Kumata et al. .......................... | 327/203 |
| 5,646,555 | 7/1997 | Morinaka ................................ | 327/201 |

OTHER PUBLICATIONS

Kenji Ishida et al, "A 10 –Ghz 8–b Mutiplexer/Demultiplexer Chip Set for the SONET STS 192 System", *IEEE Journal of Solid State Circuits,* vol 26 No. 12, Dec. 191, pp. 1936–1943.

Takashi Harada et al, "TP 10.2 51 Biopolar Multiplexer, Demultiplexer, and Prescaler ICs for 10Gb/s SONET Systems", *IEEE ,* 1993, p. 154–155.

Toshiki Seshita, "20GHz 8b Multiplexer Implemented with 0.5 µm WNx/W–Gate GaAS MESFETs" *IEEE,* 1994, pp. 172–173.

Ingmar Andersson et al, "Silcone Bipolar Chipset for SONET/SDH 10 Gbit/s Fiber–Optic Links", *IEEE ,* 1994, pp. 617–620.

Jiren Yuan et al, "High–Speed CMOS Circuit Technique", *IEEE Journal,* 1989, pp. 62–70.

Cheryl L. Stout et al., "10–Gb/s SiliconBipolar 8:1 Multiplexer and 1: 8 Demultiplexer", *IEEE Journal of Solid State Circuits,* vol. 28, No. 3 Mar. 1993, pp. 339–343.

Minoru Togashi, "10–Gb/s GasAs MESFET IC's for Utra High–Speed Transmission Systems", *IEEE,* 1990, pp. 49–52.

L. Ingmar Andersson, "Silicon Bipolar Chipset for Sonet/SDH 10 Gb/s Fiber–Optic Communication Links", IEEE Journal of Solid State Circuits, vol. 30, No. 3, Mar. 1995, pp. 210–217.

Kenji Ishida, "A 10GHz GaAs 8b Multiplexer/Demultiplexer Chip Set for the SONET STS 192 System", *ISSCC91/Sessioon 8/Hard–Disk and Data Communication IC's/Paper TP 8.4,* Feb. 14, 1991.

*Primary Examiner*—Timothy P. Callahan
*Assistant Examiner*—Terry L. Englund
*Attorney, Agent, or Firm*—Foley & Lardner

[57] ABSTRACT

In a multiplexor, respective outputs of two latches alternately brought into a dynamic holding condition at phases opposite to each other, respectively, are connected in common in a wired connection. Thus, a selector becomes unnecessary, with the result that the number of transistors driven with a clock signal can be reduced, and the electric power consumption is correspondingly reduced.

17 Claims, 25 Drawing Sheets

MULTIPLEXOR COMPOSED OF DYNAMIC LATCHES

BACKGROUND OF THE INVENTION

1. Field of the Invention

The present invention relates to a multiplexor, and more specifically to a multiplexor composed of dynamic latches.

2. Description of Related Art

A prior art multiplexor will be described with reference to an example of a 2-bit multiplexor, since a multi-bit multiplexor can be constituted by combining 2-bit multiplexors. This is well known, as already described by, for example, K. Ishida et al, "A 10-GHz 8-b Multiplexor/Demultiplexor Chip Set for the SONET STS-192 System", IEEE Journal of Solid-State Circuits, Vol.26, No.12, December 1991, pages 1936–1943, and C. L. Stout et al., "10-Gb/s Silicon Bipolar 8:1 Multiplexor and 1:8 Demultiplexor", IEEE Journal of Solid-State Circuits, Vol.28, No.3, March 1993, pages 339–343. The content of these papers are incorporated by reference in its entirety into this application.

Referring to FIG. 23, there is shown a block diagram of the basic construction for illustrating an operation principle of the prior art 2-bit multiplexor. As shown in FIG. 23, the shown 2-bit multiplexor includes a latch L1 having a data input D1 connected to a first data input terminal IN1, a non-inverted clock input C1 connected to a non-inverted clock input terminal CLK, an inverted clock input C1B connected to an inverted clock input terminal CLKB, and an output Q1 connected to a node 01, a latch L2 having a data input D2 connected to a second data input terminal IN2, a non-inverted clock input C2 connected to the non-inverted clock input terminal CLK, an inverted clock input C2B connected to the inverted clock input terminal CLKB, and an output Q2 connected to a node 02, a latch L3 having a data input D3 connected to the node 02, a non-inverted clock input C3 connected to the inverted clock input terminal CLKB, an inverted clock input C3B connected to the non-inverted clock input terminal CLK, and an output Q3 connected to a node 03, and a selector S having a first input A connected to the node 01, a second input B connected to the node 03, a non-inverted selection signal input S connected to the non-inverted clock input terminal CLK, an inverted selection signal input SB connected to the inverted clock input terminal CLKB, and an output connected to an output terminal OUT.

Now, an operation of the circuit shown in FIG. 23 will be described with reference to a timing chart shown in FIG. 24. Since an inverted signal of a signal applied to the non-inverted clock input terminal CLK is applied to the inverted clock input terminal CLKB, only the non-inverted clock input terminal CLK is shown in FIG. 24 and will be described in the following description.

When a low level signal is applied to the non-inverted clock input terminal CLK, the latch L1 and the latch L2 fetch the data, so that the fetched data is outputted from the output Q1 and Q2, and on the other hand, the output Q3 of the latch L3 holds the preceding data. When the signal applied to the non-inverted clock input terminal CLK is brought to a high level, the outputs Q1 and Q2 of the latches L1 and L2 hold the data fetched when the signal applied to the non-inverted clock input terminal CLK is at the low level. On the other hand, the latch L3 fetches the data outputted from the latch L2, so that the newly fetched data is outputted from the output Q3 of the latch L3.

As shown in FIG. 24, the output Q1 of the first latch L1 and the output Q3 of the third latch L3 are shifted in phase from each other by a half period of the clock, and are supplied to the inputs A and B of the selector S. The selector S outputs the value of the input A when the signal applied to the non-inverted clock input terminal CLK is at the high level, and the value of the input B when the signal applied to the non-inverted clock input terminal CLK is at the low level.

Referring to FIG. 25, there is shown a circuit diagram of an example of the prior art multiplexor which is constituted of the least number of circuit elements and includes the least number of transistors driven with control signals. In the circuit shown in FIG. 25, the latch L1 of FIG. 23 constituted of a transfer gate TG1 and an inverter INV1, the latch L2 of FIG. 23 constituted of a transfer gate TG2 and an inverter INV2, the latch L3 of FIG. 23 constituted of a transfer gate TG3 and an inverter INV3, and the selector S of FIG. 23 is constituted of two transfer gates TG4 and TG5.

Now, an operation of the shown in FIG. 25 will be described. When the signal applied to the non-inverted clock input terminal CLK is at the low level, the transfer gates TG1, TG2 and TG5 are opened and the transfer gate TG3 and TG4 are closed, so that nodes 101 and 103 are charged or discharged in accordance with the value of the data input terminals IN1 and IN2, respectively. As a result, an inverted value of the data input terminal IN1 is outputted to a node 102, and an inverted value of the data input terminal IN2 is outputted to a node 104, and on the other hand, an inverted value of a dynamic node 105 is outputted to the output terminal OUT. When the signal applied to the non-inverted clock input terminal CLK is brought to the high level, the transfer gates TG1, TG2 and TG5 are closed and the transfer gate TG3 and TG4 are opened, so that the inverted value of the data input terminal IN1 is outputted to the output terminal OUT.

The circuit shown in FIG. 25 is one of the circuits which are constituted of the least number of circuit elements and include the least number of transistors driven with control signals, in multiplexors composed of MOS transistors and having its amplitude fully swinging between a pair of power supply voltages. However, since the clock signals are used for controlling the latches and the selector, a large electric power is consumed for driving the latches and the selector. In addition, if a multi-bit multiplexor is constituted of 2-bit multiplexors, the electric power consumption becomes further large.

SUMMARY OF THE INVENTION

Accordingly, it is an object of the present invention to provide a multiplexor which has overcome the above mentioned defect of the conventional one.

Another object of the present invention is to provide a multiplexor having a reduced number of transistors driven with control signals, thereby to reduce the electric power consumption.

The above and other objects of the present invention are achieved in accordance with the present invention by a multiplexor comprising a plurality of latches which are brought into a dynamic holding condition at different phases, respectively, respective outputs of the plurality of latches being connected to each other in a wired connection, so that a static output of each of the plurality of latches is preferentially taken out from a wired connection node.

According to another aspect of the present invention, there is provided a multiplexor comprising a first latch having a data input receiving a first data signal and controlled by a control signal in such a manner that when the control signal is at a high level, an output of the first latch outputs the data received at the data input, and when the control signal is at a low level, the output of the first latch becomes a dynamic node holding the value when the control signal was at the high level, and a second latch having a data input receiving a second data signal and controlled by the control signal in such a manner that when the control signal is at the low level, an output of the second latch outputs the data received at the data input, and when the control signal is at the high level, the output of the second latch becomes a dynamic node holding the value when the control signal was at the low level, the output of the first latch and the output of the second latch being connected in common in a wired connection.

With this arrangement, since the latches brought into a dynamic holding condition at different phases, respectively, are connected in a wired connection, the selector becomes unnecessary, with the result that the number of transistors driven with the control signal (for example clock signal) can be reduced, and the electric power consumption is correspondingly reduced.

The above and other objects, features and advantages of the present invention will be apparent from the following description of preferred embodiments of the invention with reference to the accompanying drawings.

DESCRIPTION OF THE PREFERRED EMBODIMENTS

Now, the present invention will be described with reference to the accompanying drawings.

Figure 1:
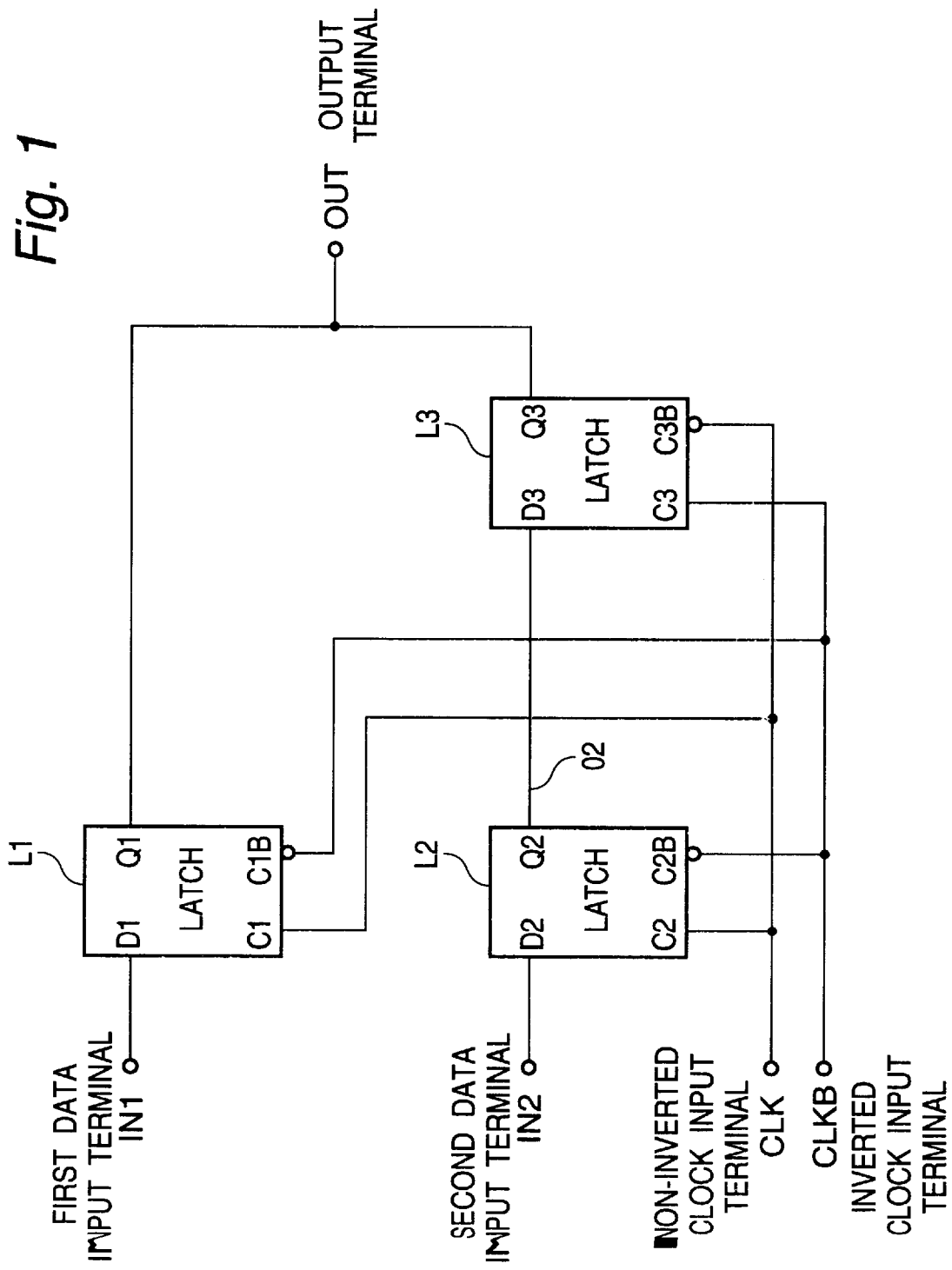
FIG. 1 is a block diagram illustrating the principle of the multiplexor in accordance with the present invention.

Referring to FIG. 1, there is shown a hiock diagram illustrating the principle of the multiplexor in accordance with the present invention.

The shown multiplexor includes a latch L1 having a data input D1 connected to a first data input terminal IN1, a non-inverted clock input C1 connected to a non-inverted clock input terminal CLK, an inverted clock input C1B connected to an inverted clock input terminal CLKB, and an output Q1 connected to an output terminal OUT, a latch L2 having a data input D2 connected to a second data input terminal IN2, a non-inverted clock input C2 connected to the non-inverted clock input terminal CLK, an inverted clock input C2B connected to the inverted clock input terminal CLKB, and an output Q2 connected to a node 02, and a latch L3 having a data input D3 connected to the node 02, a non-inverted clock input C3 connected to the inverted clock input terminal CLKB, an inverted clock input C3B connected to the non-inverted clock input terminal CLK, and an output Q3 connected to the output terminal OUT.

Figure 2:
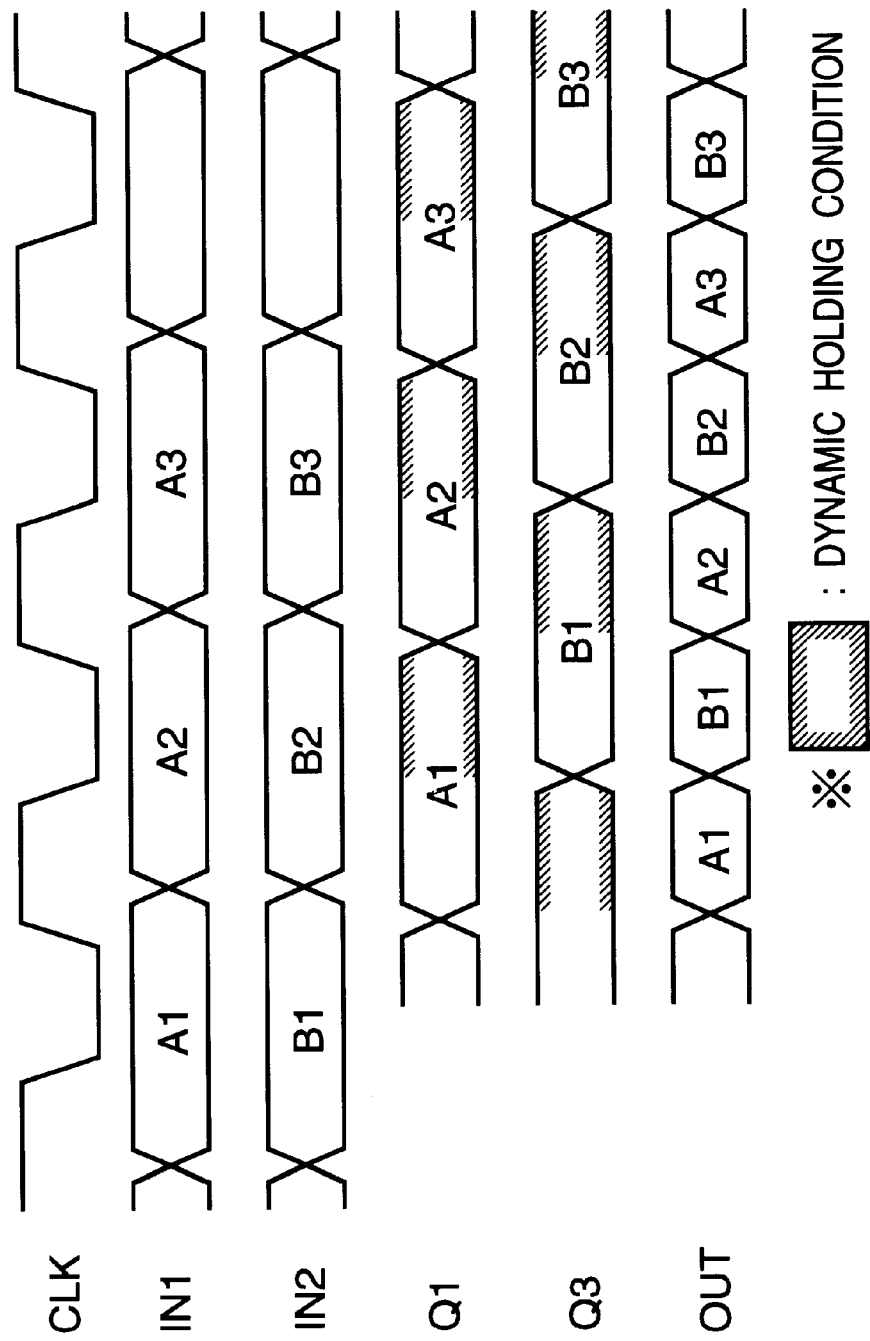
FIG. 2 is a timing chart illustrating an operation of the multiplexor in accordance with the present invention.

Referring to FIG. 2, there is shown a timing chart illustrating an operation of the multiplexor shown in FIG. 1. Now, the operation of the multiplexor shown in FIG. 1 will be described with reference to FIGS. 1 and 2.

Each of the latches L1, L2 and L3 is a dynamic latch in which when a signal applied to the non-inverted clock input C1, C2 and C3 is at a low level, a charging/discharging of an internal node in the latch is previously carried out, and on the other hand, an output of the latch holds the preceding value in a dynamic condition. When the signal applied to the non-inverted clock input C1, C2 and C3 is brought to a high level, the charging/discharging of the internal node is carried out in accordance with the value of the input of the latch, so that the value of the input of the latch is outputted from the output of the latch.

An output section of each of the latches L1 and L2 operates to take a static outputting condition when the high level is supplied to the non-inverted clock input terminal CLK, and a dynamic holding condition when the low level is supplied to the non-inverted clock input terminal CLK.

The latch L3 receives at its data input the output of the latch L2. and the latch L2 and the latch L3 operate in phase opposite to each other. Therefore, the output of the latch L2 is outputted from the output Q3 of the latch L3, delayed by a half period of the clock. However, the output section of the latch L3 operates to take a static outputting condition when the low level is supplied to the non-inverted clock input terminal CLK, and a dynamic holding condition when the high level is supplied to the non-inverted clock input terminal CLK.

Therefore, the latch L1 and the latch L3 are alternately and alternatively put in the dynamic holding condition, in phase opposite to each other. However, since the output of the latch L1 and the output of the latch L3 are connected directly to each other in a wired connection, when the high level is supplied to the non-inverted clock input terminal CLK, the output section of the latch L1 in the static outputting condition charges or discharges the output Q3 of the latch L3 which is in the dynamic holding condition, so that the output of the latch L1 is outputted from the output terminal OUT. On the other hand, when the low level is supplied to the non-inverted clock input terminal CLK, the output section of the latch L3 in the static outputting condition charges or discharges the output Q1 of the latch L1 which is in the dynamic holdine condition, so that the output of the latch L3 is outputted from the output terminal OUT.

In this multiplexor in accordance with the present invention, if the number of circuit elements and the number of control signal driven transistors in the latches L1 and L3 can be made smaller than the number of circuit elements and the number of control signal driven transistors in the latches L1 and L3 and the selector in the prior art multiplexor, the necessary circuit area can be reduced because of the reduced number of circuit elements, with the result that the wiring capacitance is correspondingly reduced. In addition, a low electric power consumption can be achieved by cooperation of the reduction of the wiring capacitance and the reduction of the driven load capacitance obtained by the reduced number of control signal driven transistors. Incidentally, since the latch L2 only has a function for shifting data, the latch L2 can be constituted of any latch, and therefore, explanation of the latch L2 will be omitted in the following description.

The latch circuit having its output section becoming a dynamic holding condition is disclosed by, for example, J. Yuan et al, "High-Speed CMOS Circuit Technique", IEEE Journal of Solid State Circuits, Vol.24, No.1, February 1989, pages 62–70, the content of which is incorporated by reference in its entirety into this application. Latch circuits shown in FIGS. 3 to 6 are quoted from this paper, and can be applied into the multiplexor in accordance with the present invention.

Figure 3:
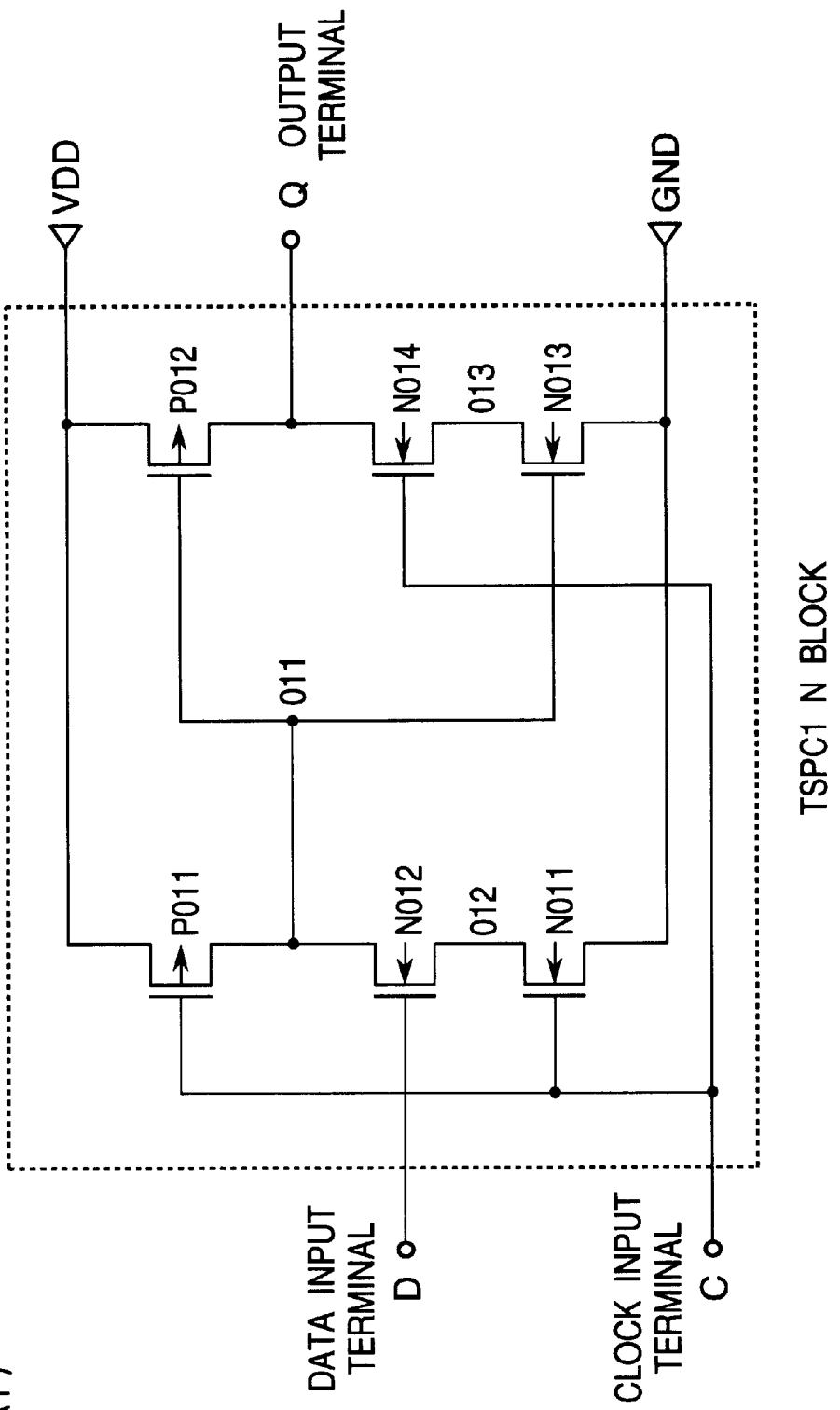
FIG. 3 is a circuit diagram of a first example the latch having an output becoming a dynamnic holding condition.

Referring to FIG. 3, the shown latch circuit includes a data input terminal D, an output terminal Q, a clock input terinal C, a high voltage side power supply terminal VDD, and a low voltage side power supply terminal GND, and comprises transistors connected as mentioned below.

The latch circuit shown in FIG. 3 comprises:

(a) a P-channel MOS transistor P011 having a source connected to the high voltage side power supply terminal VDD, a drain connected to a node 011, and a gate connected to the clock input terminal C;

(b) an N-channel MOS transistor N011 having a source connected to the low voltage side power supply terminal GND, a drain connected to a node 012, and a gate connected to the clock input terminal C;

(c) an N-channel MOS transistor N012 having a source connected to the node 012, a drain connected to the node 011, and a gate connected to the data input terminal D;

(d) a P-channel MOS transistor P012 having a source connected to the high voltage side power supply terminal VDD, a drain connected to the output terminal Q, and a gate connected to the node 011;

(e) an N-channel MOS transistor N013 having a source connected to the low voltage side power supply terminal GND, a drain connected to a node 013, and a gate connected to the node 011; and (f) an N-channel MOS transistor N014 having a source connected to the node 013, a drain connected to the output terminal Q, and a gate connected to the clock input terminal C.

The circuit shown in FIG. 3 is called a "true single-phase clock 1" (TSPC1) in the above quoted paper and will be called a "TSPC1 N block" hereinafter. Now, an operation of the "TSPC1 N block" will be described.

When a low level signal is applied to the clock input terminal C, the P-channel MOS transistor P011 is turned on, and the N-channel MOS transistors N011 and N014 are turned off, so that the node 011 is charged to the high level. Therefore, the P-channel MOS transistor P012 is turned off, so that the output terminal Q becomes a dynamic node, holding the preceding condition.

When the signal applied to the clock input terminal C is brought to a high level, the P-channel MOS transistor P011 is turned off, and the N-channel MOS transistors N011 and N014 are turned on. At this time, if the high level signal is applied to the data input terminal D, the N-channel MOS transistor N012 is turned on, so that the node 011 is discharged into the low level, and therefore, the P-chaniiel MOS transistor P012 is turned on and the N-channel MOS transistor N013 is turned off, with the result that the high level is outputted from the output terminal Q. On the other hand, if the low level signal is applied to the data input terminal D, the N-channel MOS transistor N012 is turned off, so that the node 011 becomes the dynamic node and holds the high level, and therefore, the P-channel MOS transistor P012 is turned off and the N-channel MOS transistor N013 is turned on, with the result that the low level is outputted from the output terminal Q.

Figure 4:
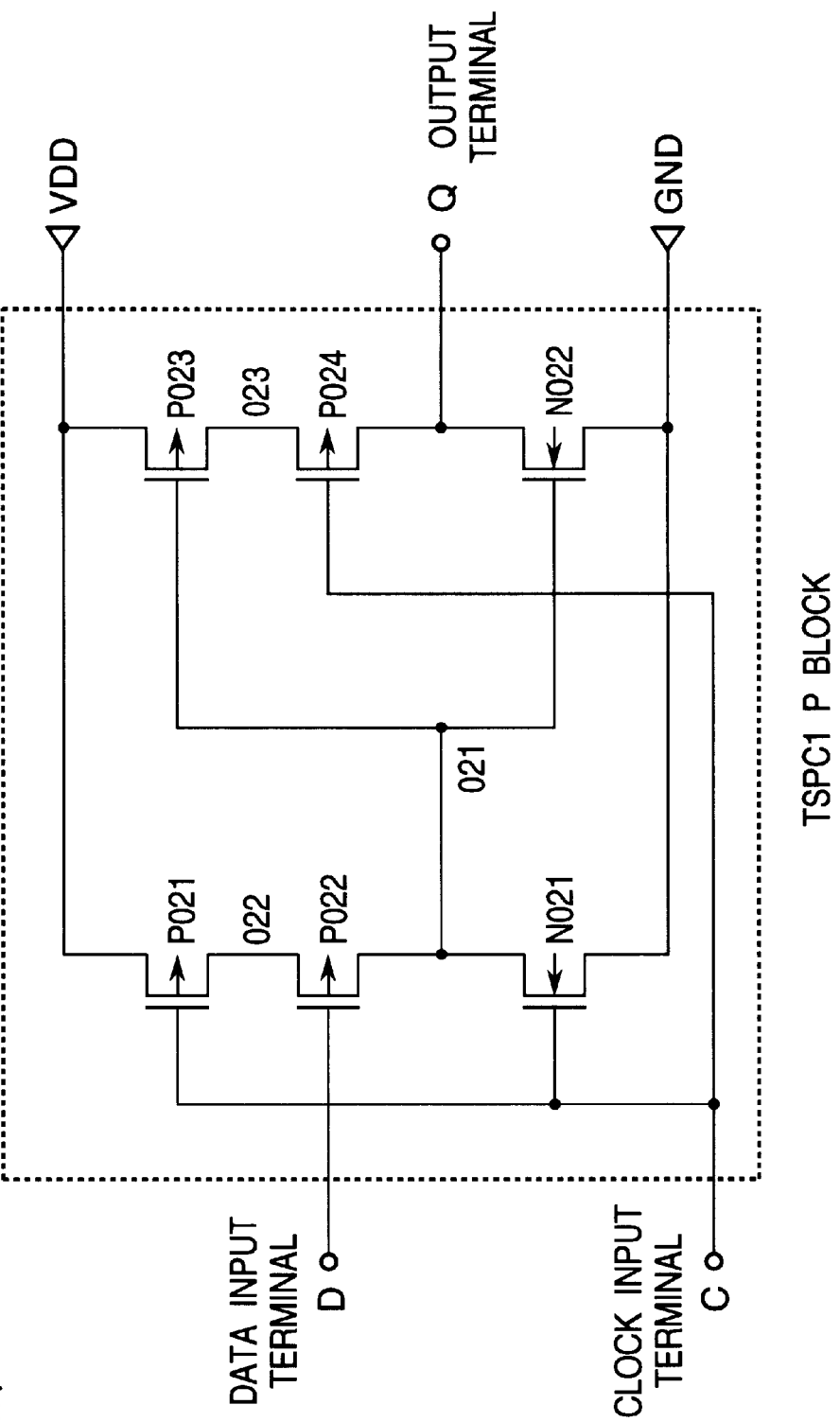
FIG. 4 is a circuit diagram of a second example the latch having an output becoming a dynamic holding condition.

Referring to FIG. 4, the shown latch circuit, which will be called a "TSPC1 P block" hereinafter, includes a data input tennminal D, an output terminal Q, a clock input terminal C, a high voltage side power supply terminal VDD, and a low voltage side power supply terminal GND, and comprises transistors connected as mentioned below.

The latch circuit shown in FIG. 4 comprises:

(a) a P-channel MOS transistor P021 having a source connected to the high voltage side power supply terminal VDD, a drain connected to a node 022, and a gate connected to the clock input terminal C;

(b) a P-channel MOS transistor P022 having a source connected to the node 022, a drain connected to a node 021, and a gate connected to the data input terminal D;

(c) an N-channel MOS transistor N021 having a source connected to the low voltage side power supply terminal GND, a drain connected to the node 021, and a gate connected to the clock input tenninal C;

(d) a P-channel MOS transistor P023 having a source connected to the high voltage side power supply terminal VDD, a drain connected to a node 023, and a gate connected to the node 021;

(e) a P-channel MOS transistor P024 having a source connected to the node 023, a drain connected to the output terminal Q, and a gate connected to the clock input terminal C; and (f) an N-channel MOS transistor N022 having a source connected to the low voltage side power supply terminal GND, a drain connected to the output terninal Q, and a gate connected to the node 021.

Now, an operation of the "TSPC1 P block" circuit shown in FIG. 4 will be described.

When a high level signal is applied to the clock input terminal C, the N-channel MOS transistor N021 is turned on, and the P-channel MOS transistors P021 and P024 are turned off, so that the node 021 is discharged to the low level. Therefore, the N-channel MOS transistor N022 is turned off, so that the output terminal Q becomes a dynamic node, holding the preceding condition.

When the signal applied to the clock input terminal C is brought to a low level, the N-channel MOS transistor N021 is turned off, and the P-channel MOS transistors P021 and P024 are turned on. At this time, if the low level signal is applied to the data input terminal D, the P-channel MOS transistor P022 is turned on, so that the node 021 is charged into the high level, and therefore, the N-channel MOS transistor N022 is turned on and the P-channel MOS transistor P023 is turned off, with the result that the low level is outputted from the output terminal Q. On the other hand, if the high level signal is applied to the data input terminal D, the P-channel MOS transistor P022 is turned off, so that the node 021 becomes the dynamic node and holds the low level, and therefore, the N-channel MOS transistor N022 is turned off and the P-channel MOS transistor P023 is turned on, with the result that the high level is outputted from the output terminal Q.

Figure 5:
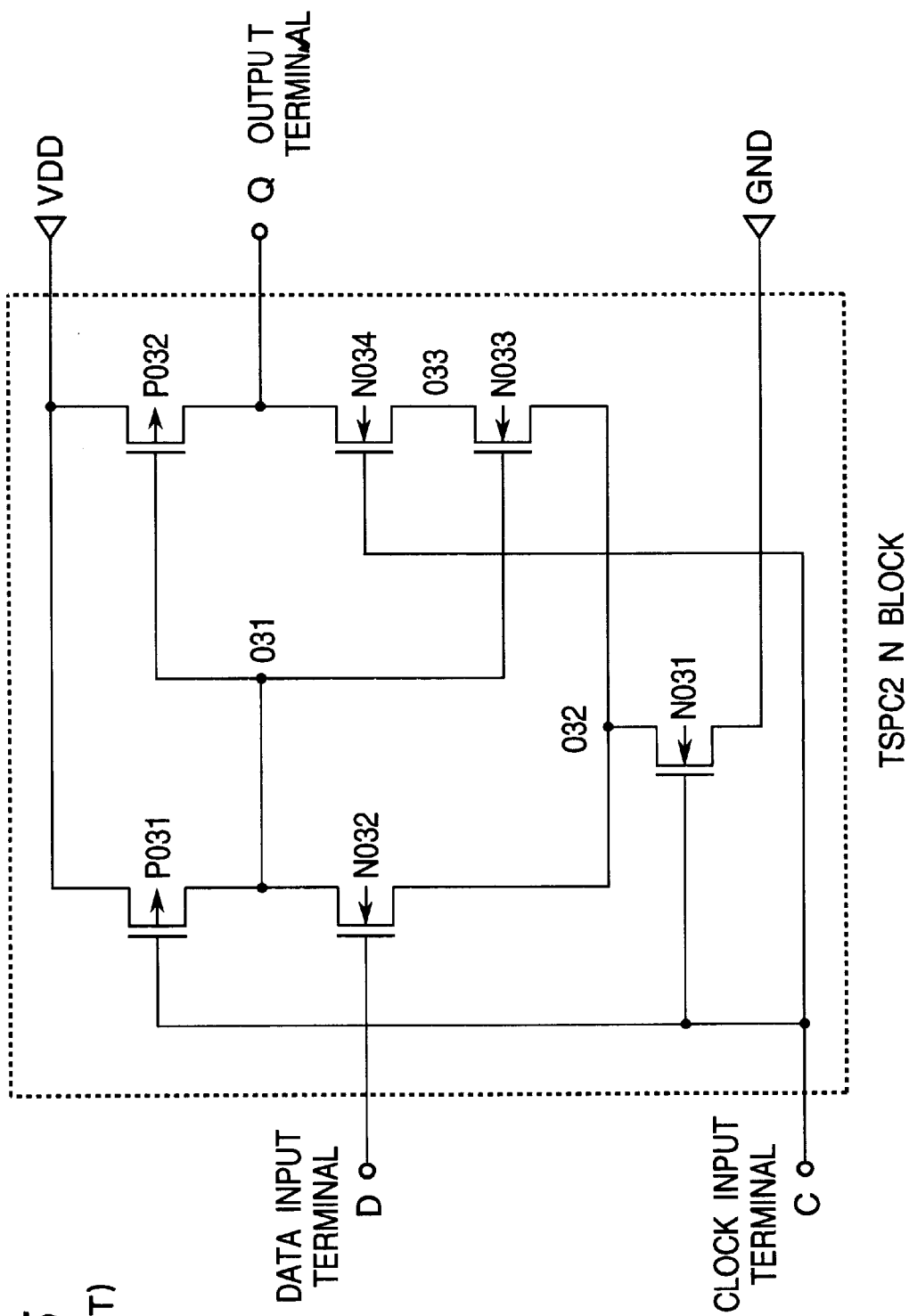
FIG. 5 is a circuit diagrain of a third example the latch having an output becoming a dynamic holding condition.

Referring to FIG. 5, the shown latch circuit, which will be called a "TSPC2 N block" hereinafter, includes a data input terminal D, an output terminal Q, a clock input terminal C, a high voltage side power supply terminal VDD, and a low voltage side power supply terminal GND, and comprises transistors connected as mentioned below.

The latch circuit shown in FIG. 5 comprises:

(a) a P-channel MOS transistor P031 having a source connected to the high voltage side power supply terminal VDD, a drain connected to a node 031, and a gate connected to the clock input terminal C;

(b) an N-channel MOS transistor N031 having a source connected to the low voltage side power supply terminal GND, a drain connected to a node 032, and a gate connected to the clock input terminal C;

(c) an N-channel MOS transistor N032 having a source connected to the node 032, a drain connected to the node 031, and a gate connected to the data input terminal D;

(d) a P-channel MOS transistor P032 having a source connected to the high voltage side power supply terminal VDD, a drain connected to the output terminal Q, and a gate connected to the node 031;

(e) an N-channel MOS transistor N033 having a source connected to the node N032, a drain connected to a node 033, and a gate connected to the node 031; and (f) an N-channel MOS transistor N034 having a source connected to the node 033, a drain connected to the output terminal Q, and a gate connected to the clock input terminal C.

Now, an operation of the "TSPC2 N block" circuit shown in FIG. 5 will be described.

When a low level signal is applied to the clock input terminal C, the P-channel MOS transistor P031 is turned on, and the N-channel MOS transistors N031 and N034 are turned off, so that the node 031 is charged to the high level. Therefore, the P-channel MOS transistor P032 is turned off, so that the output terminal Q becomes a dynamic node, holding the preceding condition.

When the signal applied to the clock input terminal C is brought to a high level, the P-channel MOS transistor P031 is turned off, and the N channel MOS transistors N031 and N034 are turned on. At this tirne, if the high level signal is applied to the data input terminal D, the N-channel MOS transistor N032 is turned on, so that the node 031 is discharged into the low level, and therefore, the P-channel MOS transistor P032 is turned on and the N-channel MOS transistor N033 is turned off, with the result that the high level is outputted from the output terminal Q. On the other hand, if the low level signal is applied to the data input terminal D, the N-channel MOS transistor N032 is turned off, so that the node 031 becomes the dynamic node and holds the high level, and therefore, the P-channel MOS transistor P032 is turned off and the N-channel MOS transistor N033 is turned on, with the result that the low level is outputted from the output terminal Q.

Figure 6:
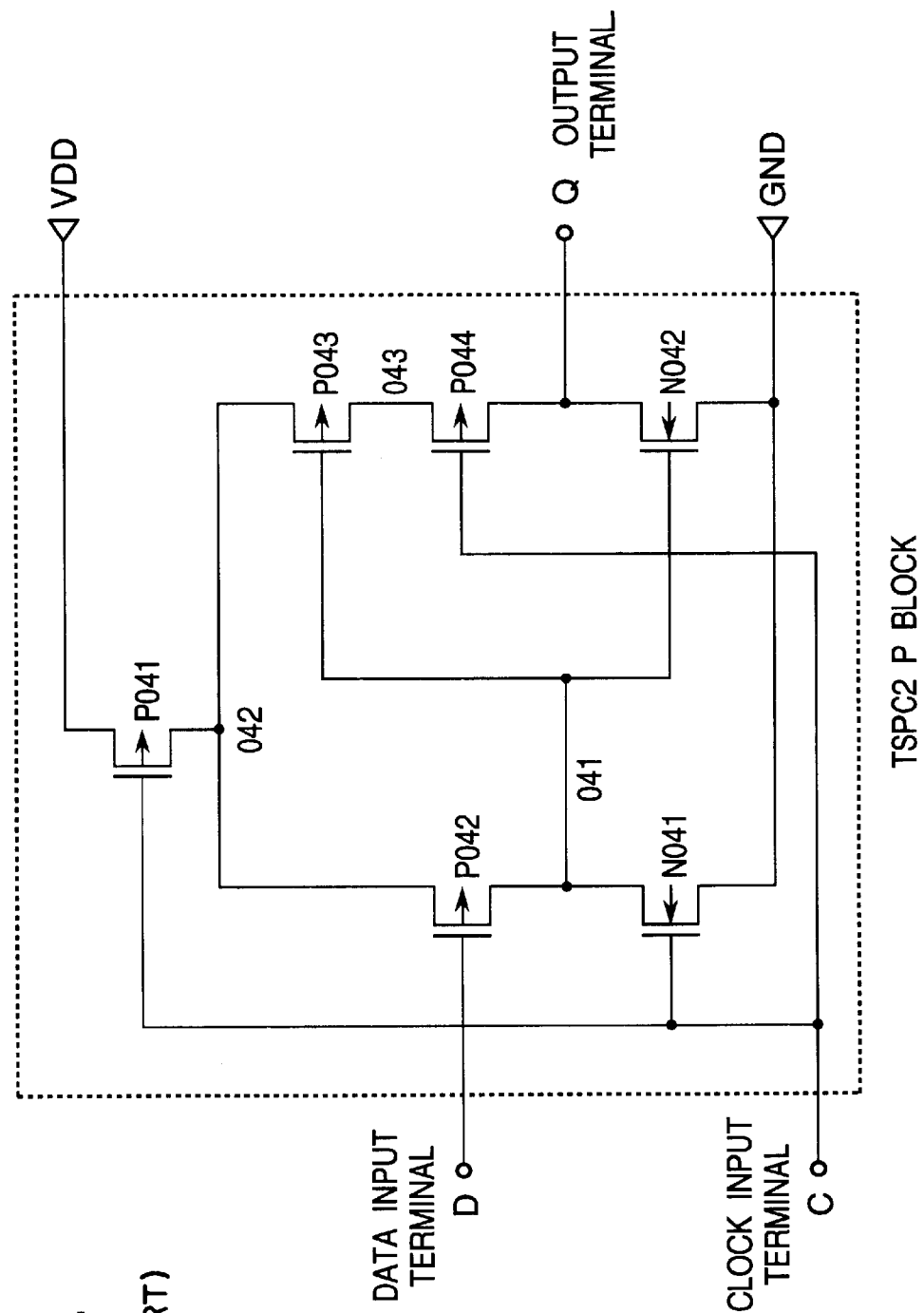
FIG. 6 is a circuit diagram of a fourth example the latch having an output becoming a dynamic holding condition.

Referring to FIG. 6, the shown latch circuit, which will be called a "TSPC2 P block" hereinafter, includes a data input terminal D, an output terminal Q, a clock input terminal C, a high voltage side power supply terminal VDD, and a low voltage side power supply terminal GND, and comprises transistors connected as mentioned below.

The latch circuit shown in FIG. 6 comprises:

(a) a P-channel MOS transistor P041 having a source connected to the high voltage side power supply terminal VDD, a drain connected to a node 042, and a gate connected to the clock input terminal C;

(b) a P-channel MOS transistor P042 having a source connected to the node 042, a drain connected to a node 041, and a gate connected to the data input terminal D;

(c) an N-channel MOS transistor N041 having a source connected to the low voltage side power supply terminal GND, a drain connected to the node 041, and a gate connected to the clock input terminal C;

(d) a P-channel MOS transistor P043 having a source connected to the node 042, a drain connected to a node 043, and a gate connected to the node 041;

(e) a P-channel MOS transistor P044 having a source connected to the node 043, a drain connected to the output terminal Q, and a gate connected to the clock input terminal C; and (f) an N-channel MOS transistor N042 having a source connected to the low voltage side power supply terminal GND, a drain connected to the output terminal Q, and a gate connected to the node 041.

Now, an operation of the "TSPC2 P block" circuit shown in FIG. 6 will be described.

When a high level signal is applied to the clock input terminal C, the N-channel MOS transistor N041 is turned on, and the P-channel MOS transistors P041 and P044 are turned off, so that the node 041 is discharged to the low level. Therefore, the N-channel MOS transistor N042 is turned off, so that the output terminal Q becomes a dynamic node, holding the preceding condition.

When the signal applied to the clock input terminal C is brought to a low level, the N-channel MOS transistor N044 is turned off, and the P-channel MOS transistors P041 and P044 are turned on. At this time, if the low level signal is applied to the data input terminal D, the P channel MOS transistor P042 is turned on, so that the node 041 is charged into the high level, and therefore, the N-channel MOS transistor N042 is turned on and the P-channel MOS transistor P043 is turned off, with the result that the low level is outputted from the output terminal Q. On the other hand, if the high level signal is applied to the data input terminal D, the P-channel MOS transistor P042 is turned off, so that the node 041 becomes the dynamic node and holds the low level, and therefore, the N-channel MOS transistor N042 is turned off and the P-channel MOS transistor P043 is turned on, with the result that the high level is outputted from the output terminal Q.

Figure 7:
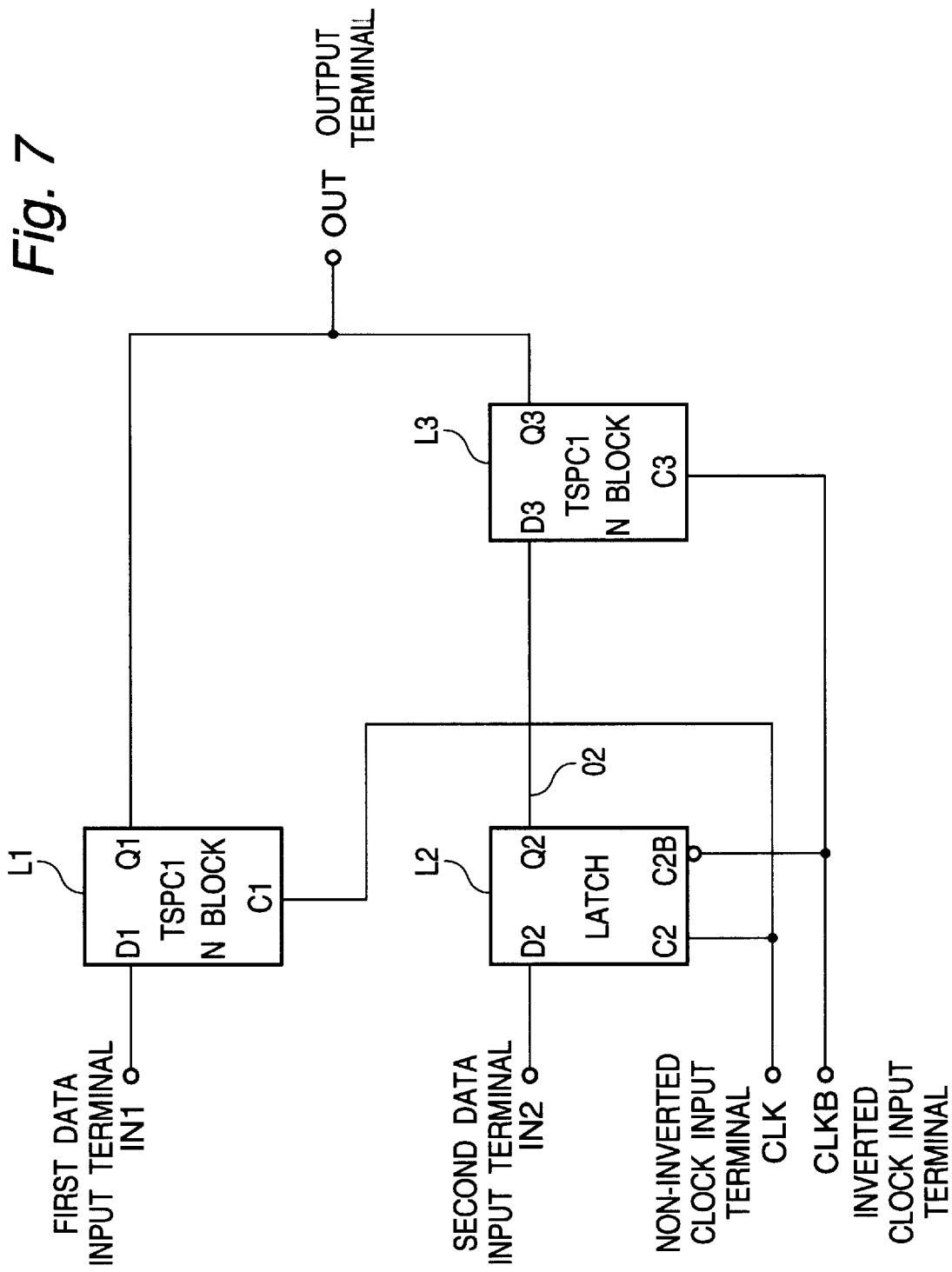
FIG. 7 is a block diagram of a first embodiment of the multiplexor in accordance with the present invention.

Referring to FIG. 7, there is shown a block diagram of a first embodiment of the multiplexor in accordance with the present invention.

In the multiplexor shown in FIG. 7, each of the latches L1 and L3 is constituted of the TSPC1 N block shown in FIG. 3. The non-inverted clock input terminal CLK is connected to the clock input C1 of the latch L1, and the inverted input terminal CLKB is connected to the clock input C3 of the latch L3.

Figure 8:
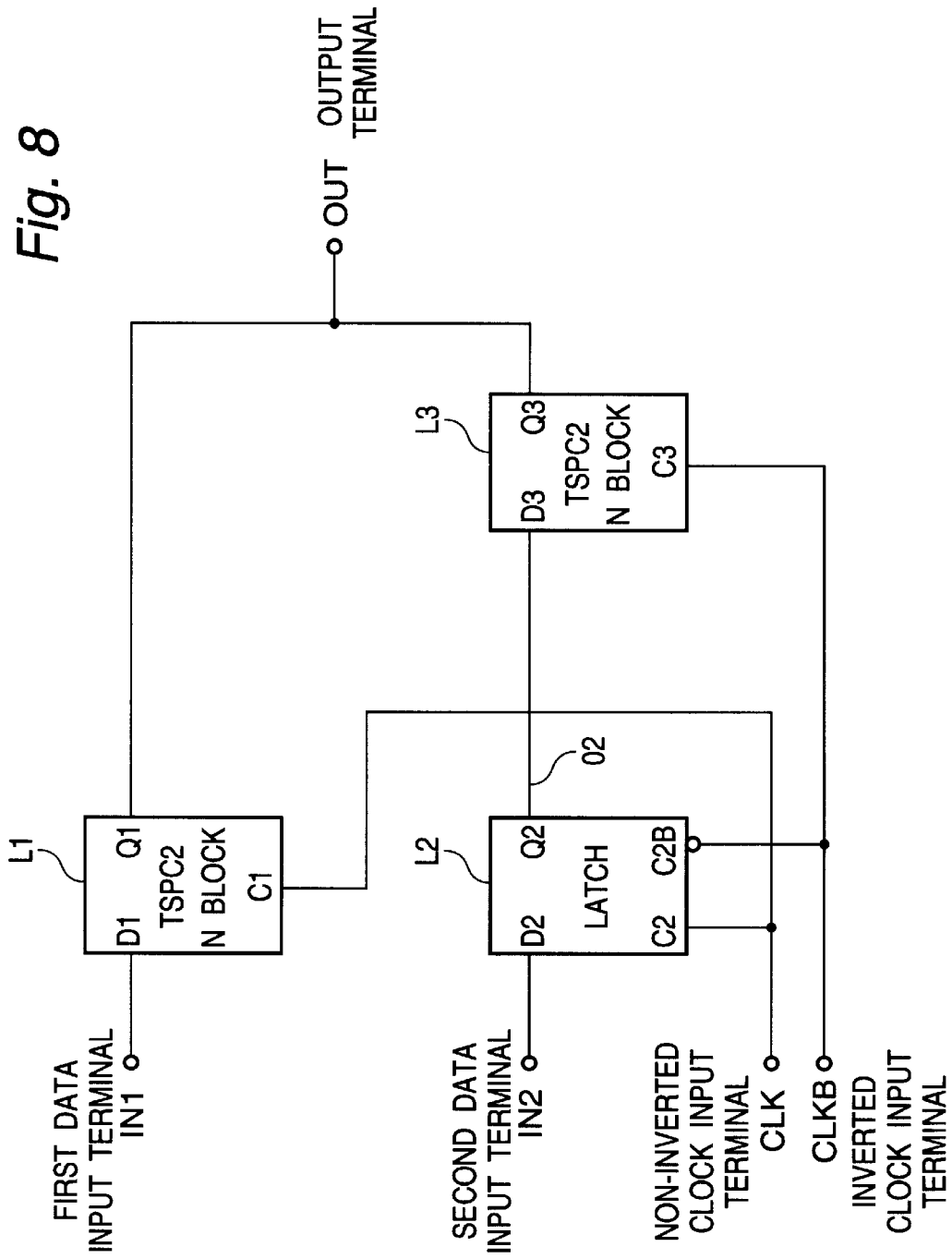
FIG. 8 is a block diagram of a second embodiment of the multiplexor in accordance with the present invention.

Referring to FIG. 8, there is shown a block diagram of a second embodiment of the multiplexor in accordance with the present invention.

In the multiplexor shown in FIG. 8, each of the latches L1 and L3 is constituted of the TSPC2 N block shown in FIG. 5. The non-inverted clock input terminal CLK is connected to the clock input C1 of the latch L1, and the inverted input terminal CLKB is connected to the clock input C3 of the latch L3.

Figure 9:
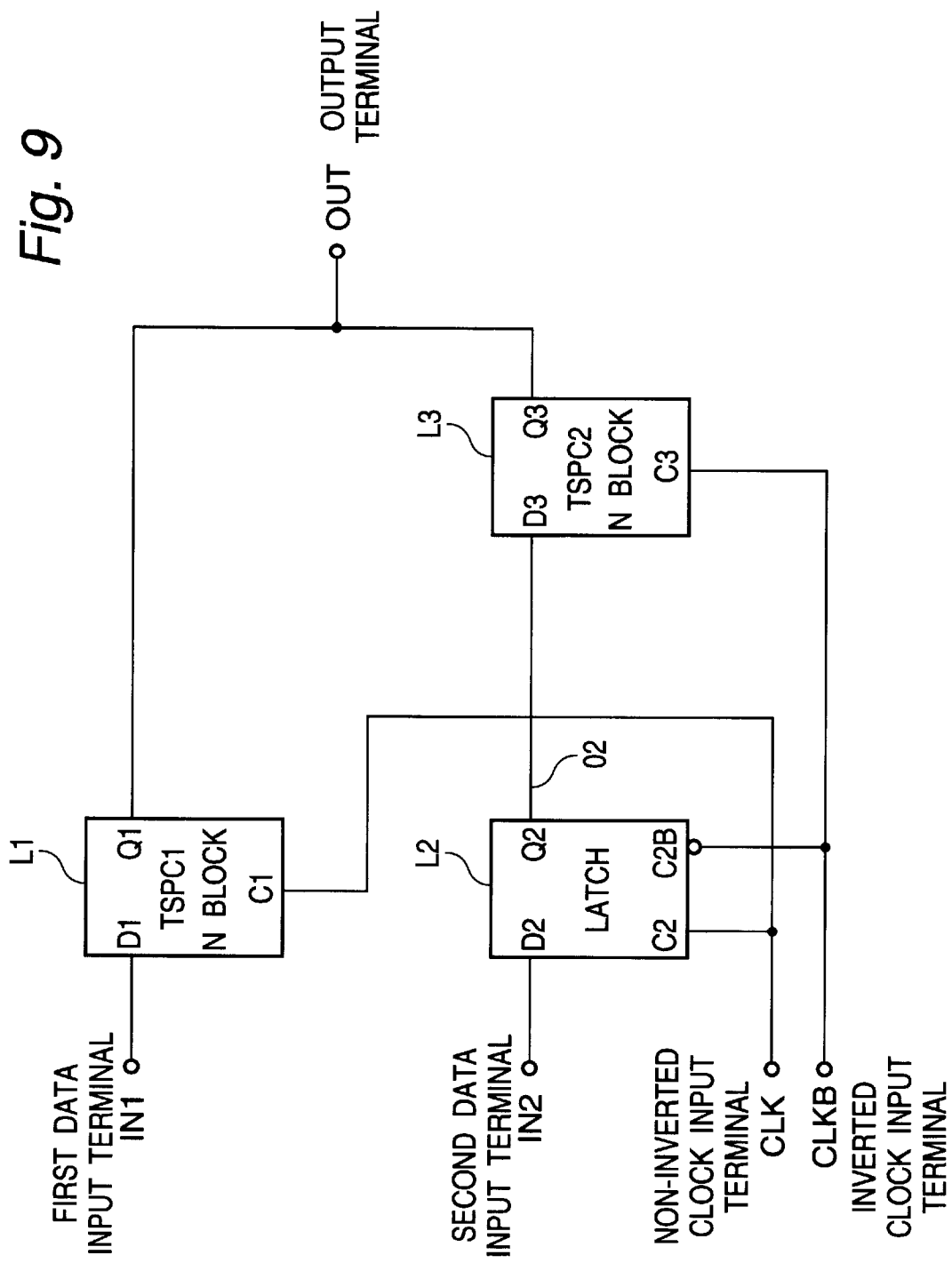
FIG. 9 is a block diagram of a third embodiment of the multiplexor in accordance with the present invention.

Referring to FIG. 9, there is shown a block diagram of a third embodiment of the multiplexor in accordance with the present invention.

In the multiplexor shown in FIG. 9, the latch Li is constituted of the TSPC1 N block shown in FIG. 3, and the latch L3 is constituted of the TSPC2 N block shown in FIG. 5. The non-inverted clock input terminal CLK is connected to the clock input C1 of the latch L1, and the inverted input terminal CLKB is connected to the clock input C3 of the latch L3.

Figure 10:
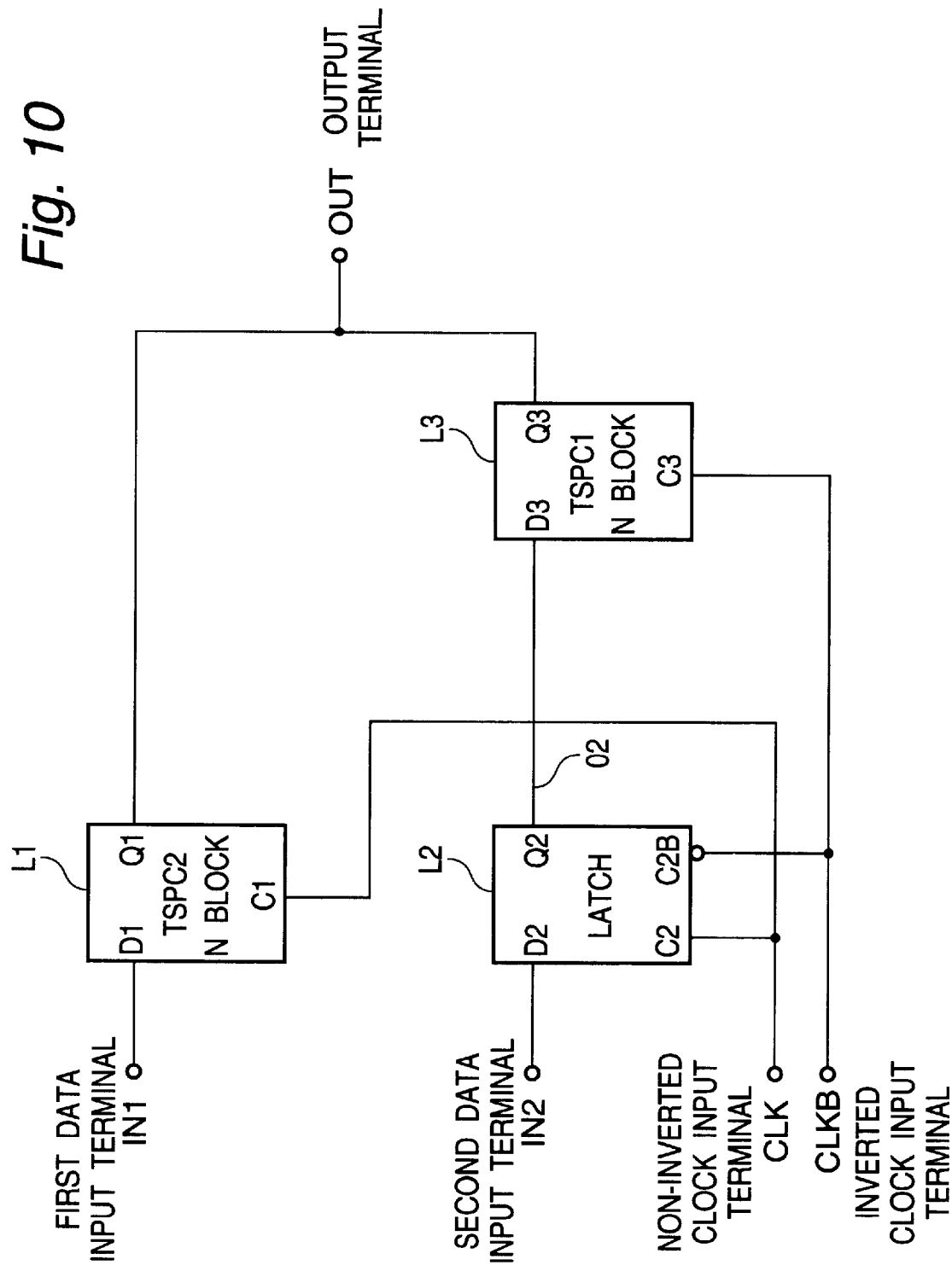
FIG. 10 is a block diagram of a fourth embodiment of the multiplexor in accordance with the present invention.

Referring to FIG. 10, there is shown a block diagram of a fourth embodiment of the multiplexor in accordance with the present invention.

In the multiplexor shown in FIG. 10, the latch L1 is constituted of the TSPC2 N block shown in FIG. 5, and the latch L3 is constituted of the TSPC1 N block shown in FIG. 3. The non-inverted clock input terminal CLK is connected to the clock input C1 of the latch L1, and the inverted input terminal CLKB is connected to the clock input C3 of the latch L3.

Referring to FIG. I1, there is shown a block diagram of a fifth embodimnent of the multiplexor in accordance with the present invention.

Figure 11:
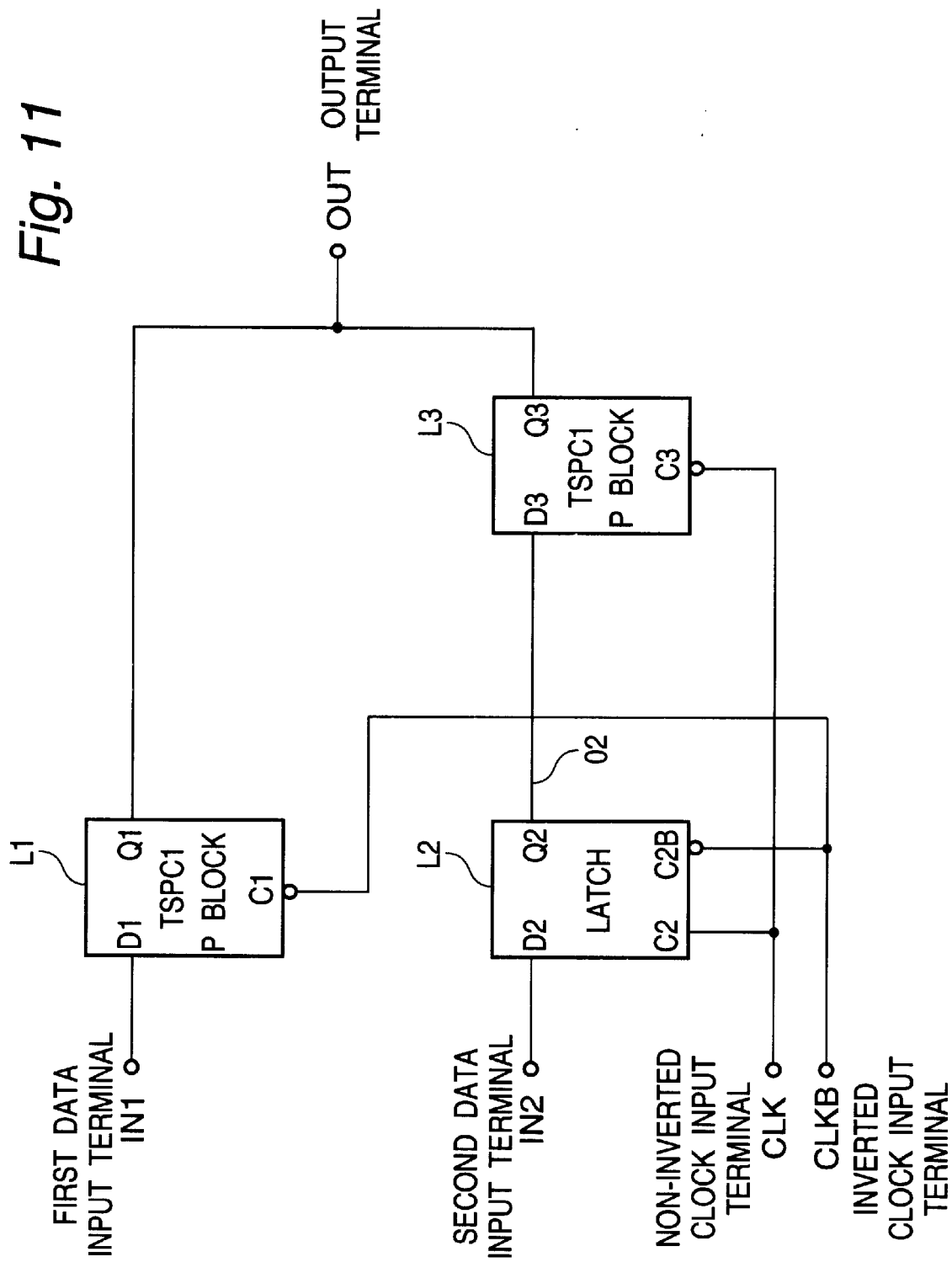
FIG. 11 is a block diagram of a fifth embodiment of the multiplexor in accordance with the present invention.

In the multiplexor shown in FIG. 11, each of the latches L1 and L3 is constituted of the TSPC1 P block shown in FIG. 4. The non-inverted clock input terminal CLK is connected to the clock input C3 of the latch L3, and the inverted input terminal CLKB is connected to the clock input C1 of the latch L1.

Figure 12:
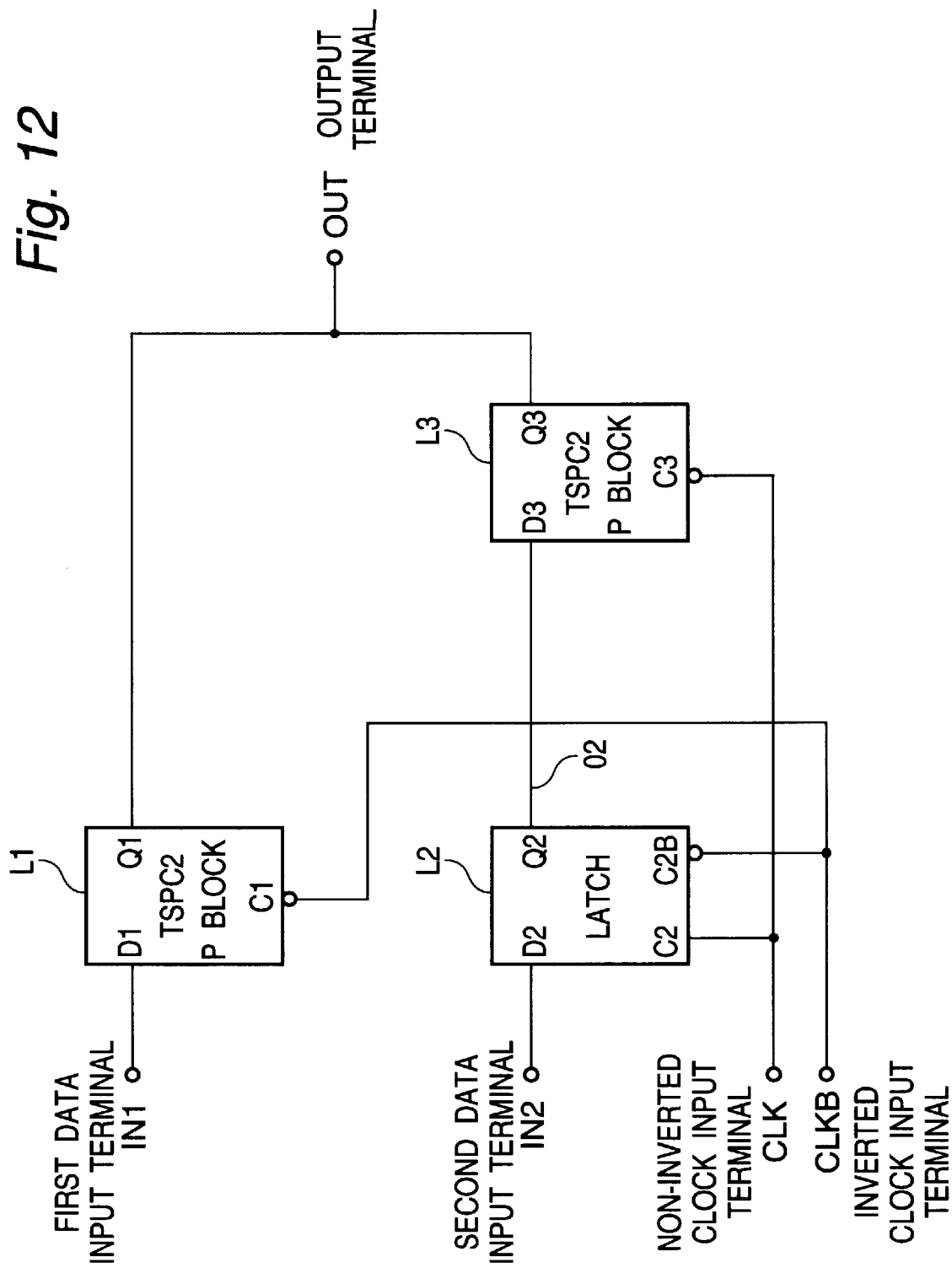
FIG. 12 is a block diagram of a sixth embodiment of the multiplexor in accordance with the present invention.

Referring to FIG. 12, there is shown a block diagram of a sixth embodiment of the multiplexor in accordance with the present invention.

In the multiplexor shown in FIG. 12, each of the latches L1 and L3 is constituted of the TSPC2 P block shown in FIG. 6. The non-inverted clock input terminal CLK is connected to the clock input C3 of the latch L3, and the inverted input terminal CLKB is connected to the clock input C1 of the latch L1.

Figure 13:
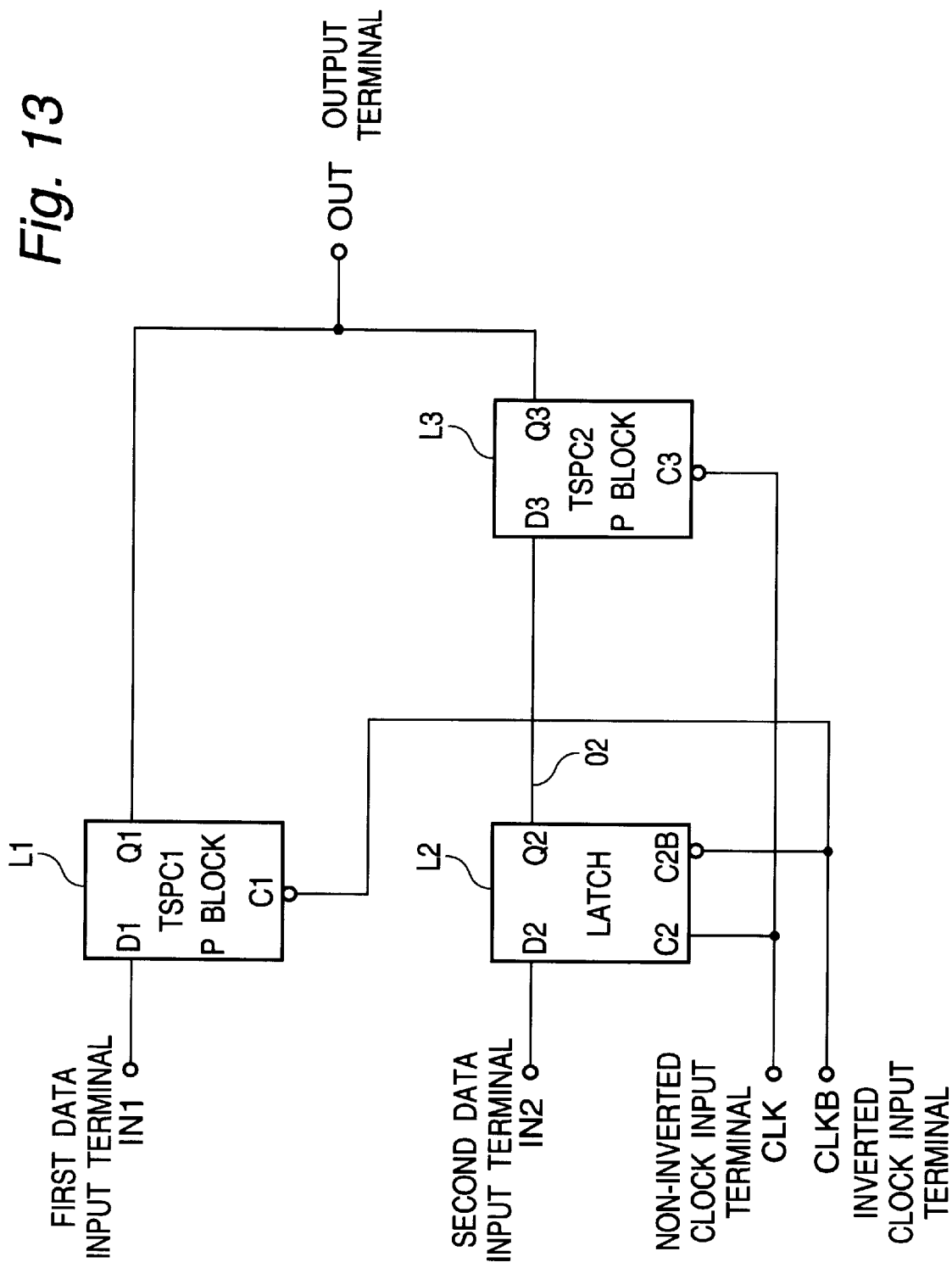
FIG. 13 is a block diagram of a seventh embodiment of the multiplexor in accordance with the present invention.

Referring to FIG. 13, there is shown a block diagram of a seventh embodiment of the multiplexor in accordance with the present invention.

In the multiplexor shown in FIG. 13, the latch L1 is constituted of the TSPC1 P block shown in FIG. 4, and the latch L3 is constituted of the TSPC2 P block shown in FIG. 6. The non-inverted clock input terminal CLK is connected to the clock input C3 of the latch L3, and the inverted input terminal CLKB is connected to the clock input C1 of the latch L1.

Figure 14:
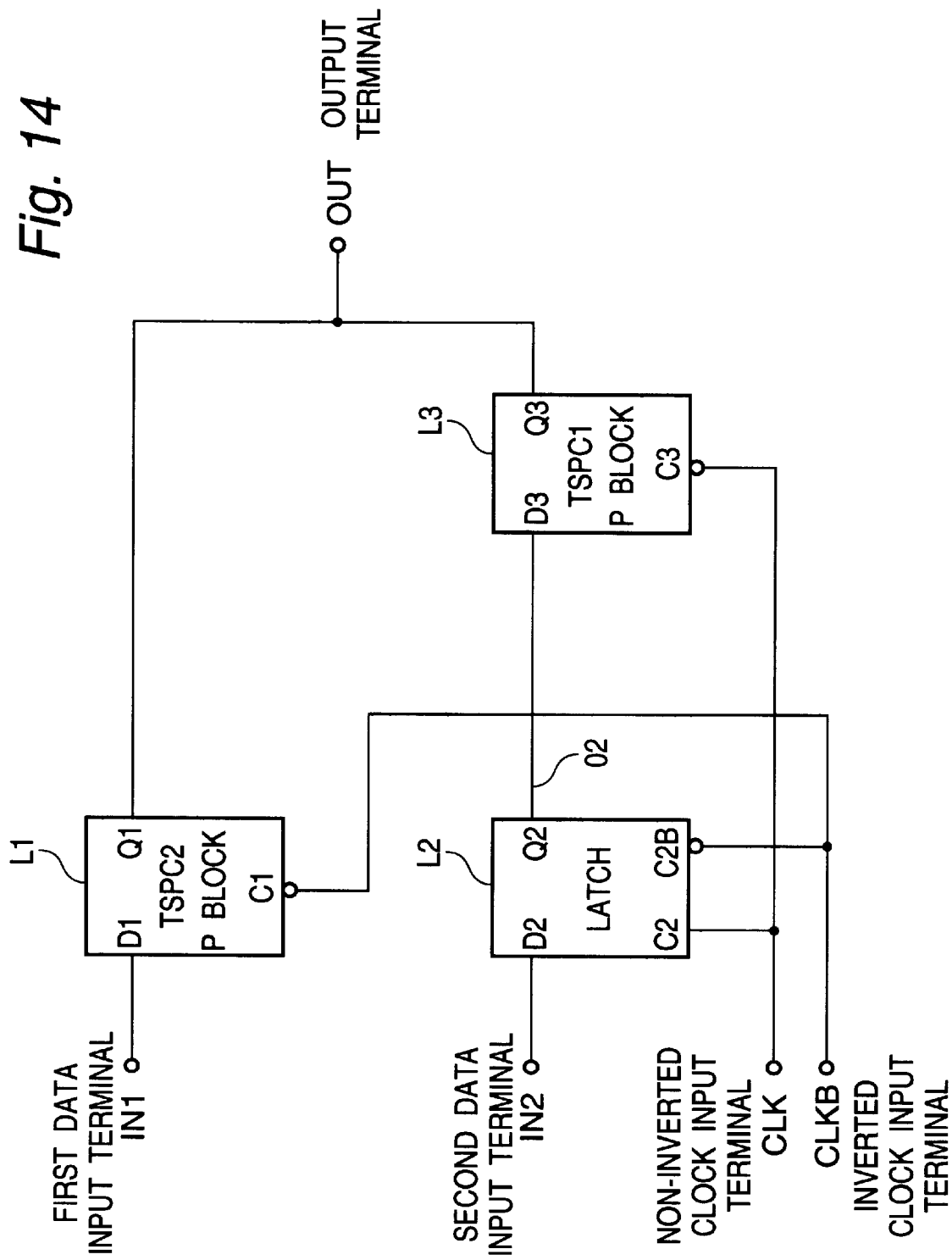
FIG. 14 is a block diagram of an eighth embodiment of the multiplexor in accordance with the present invention.

Referring to FIG. 14, there is shown a block diagram of an eighth embodiment of the multiplexor in accordance with the present invention.

In the multiplexor shown in FIG. 14, the latch L1 is constituted of the TSPC2 P block shown in FIG. 6, and the latch L3 is constituted of the TSPC1 P block shown in FIG. 4. The non-invited clock input terminal CLK is connected to the clock input C3 of the latch L3, and the inverted input terminal CLKB is connected to the clock input C1 of the latch L1.

Figure 15:
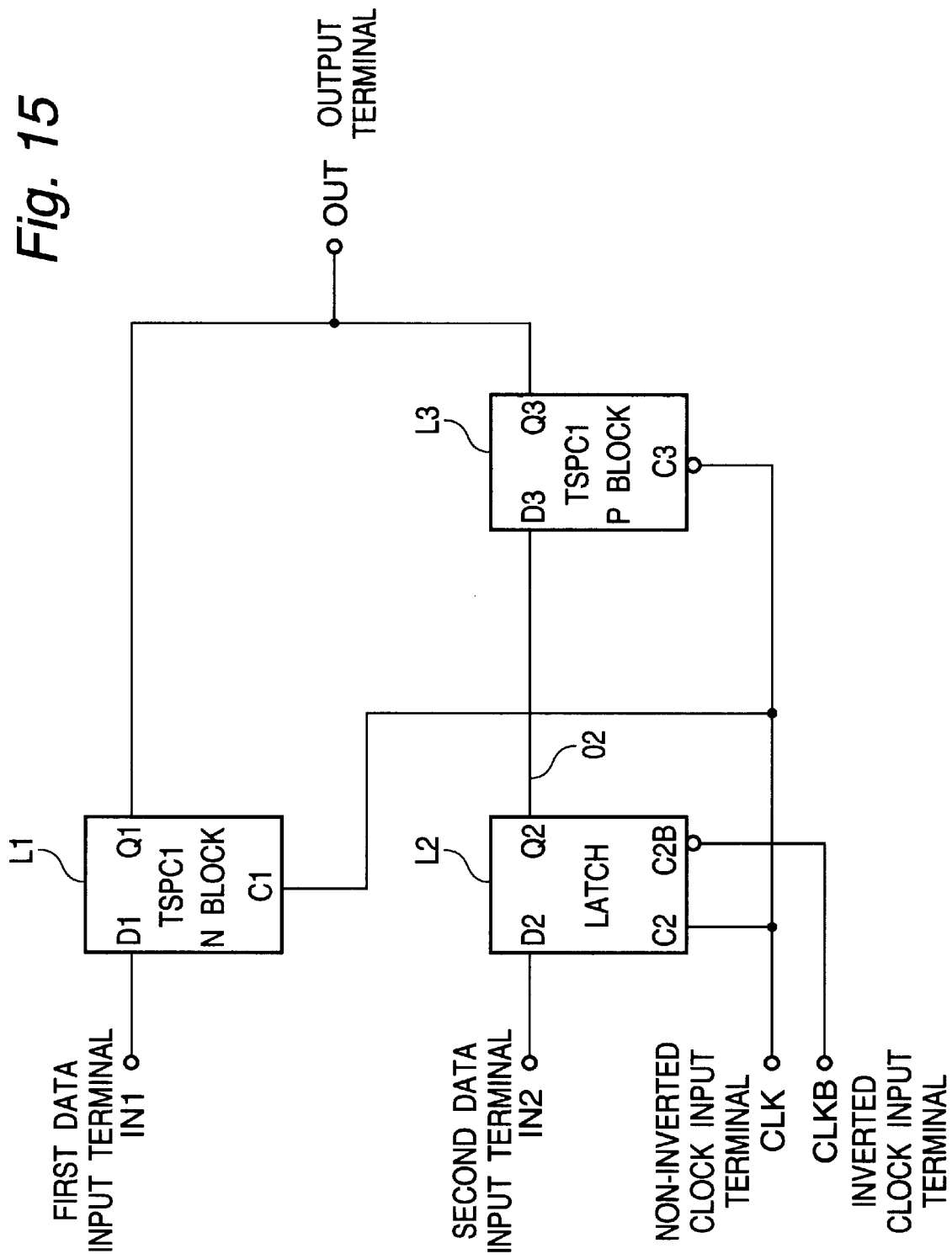
FIG. 15 is a block diagram of a ninth embodiment of the multiplexor in accordance with the present invention.

Referring to FIG. 15, there is shown a block diagram of a ninth embodiment of the multiplexor in accordance with the present invention.

In the multiplexor shown in FIG. 15, the latch L1 is constituted of the TSPC1 N block shown in FIG. 3, and the latch L3 is constituted of the TSPC1 P block shown in FIG. 4. The non-inverted clock input terminal CLK is connected to the clock inputs C1 and C3 of the latches L1 and L3.

Figure 16:
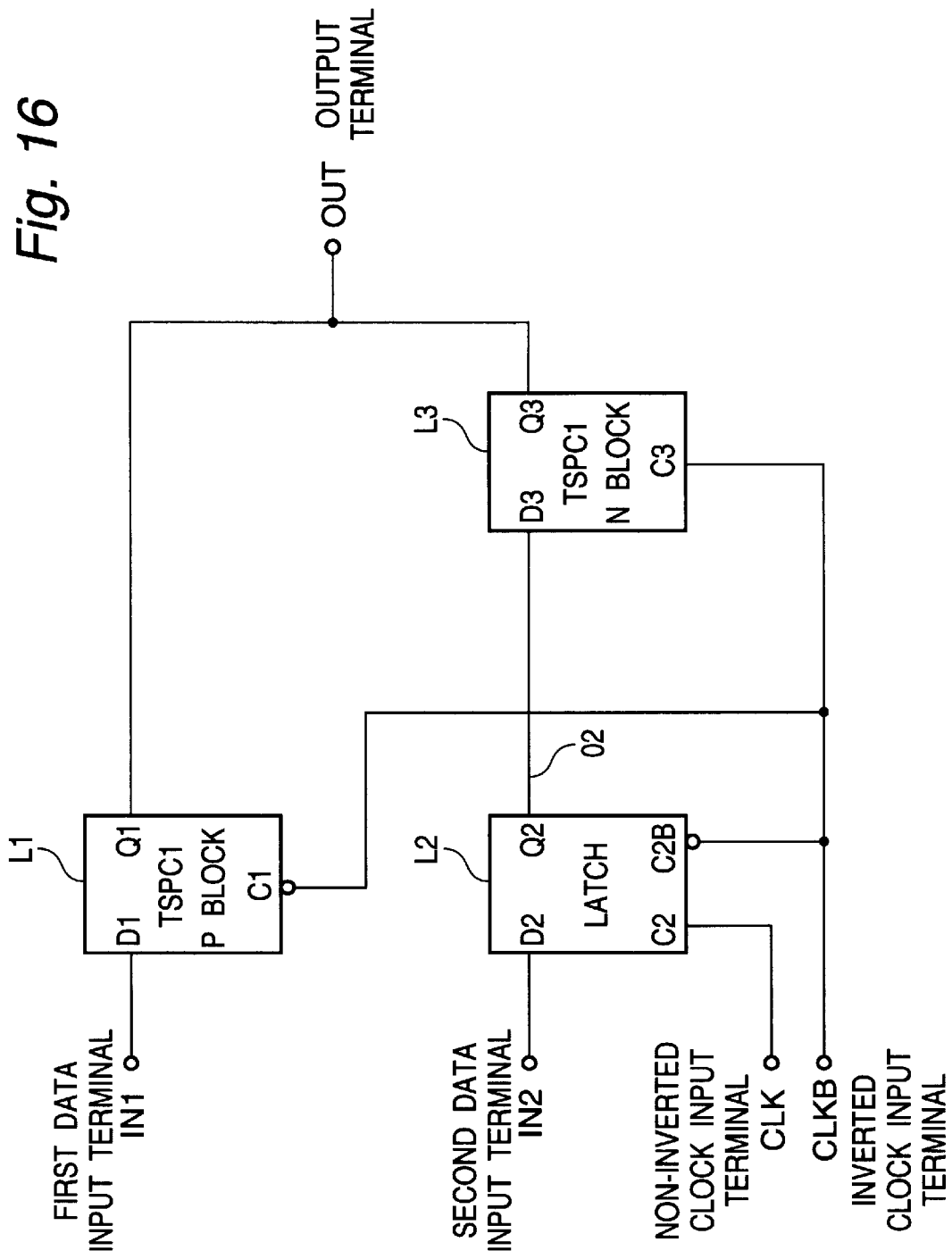
FIG. 16 is a block diagram of a tenth embodiment of the multiplexor in accordance with the present invention.

Referring to FIG. 16, there is shown a block diagram of a tenth embodiment of the multiplexor in accordance with the present invention.

In the multiplexor shown in FIG. 16, the latch L1 is constituted of the TSPC1 P block shown in FIG. 4, and the latch L3 is constituted of the TSPC1 N block shown in FIG. 3. The inverted clock input terminal CLKB is connected to the clock inputs C1 and C3 of the latches L1 and L3.

Figure 17:
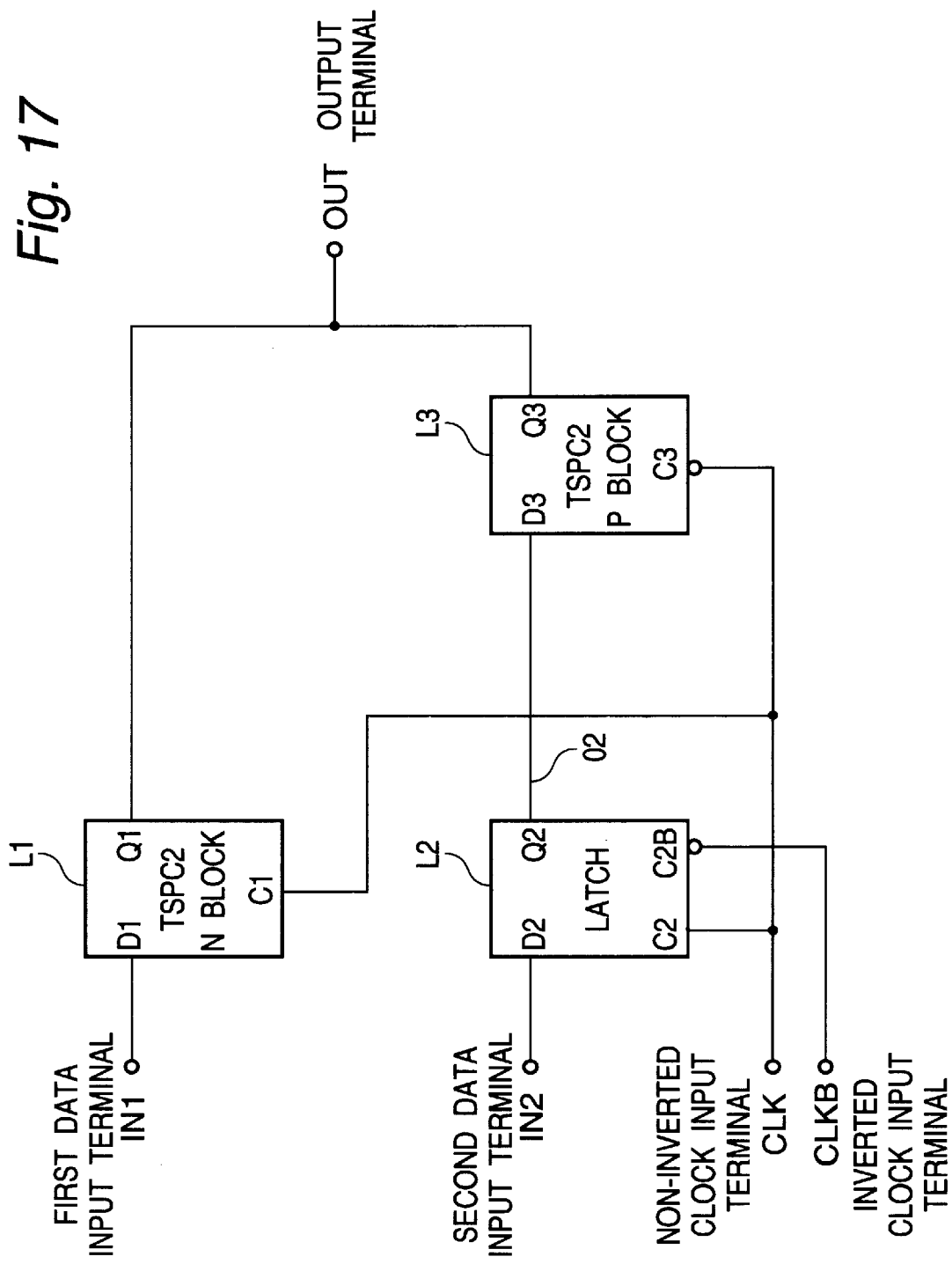
FIG. 17 is a block diagram of an eleventh embodiment of the multiplexor in accordance with the present invention.

Referring to FIG. 17, there is shown a block diagram of an eleventh embodiment of the multiplexor in accordance with the present invention.

In the multiplexor shown in FIG. 17, the latch L1 is constituted of the TSPC2 N block shown in FIG. 5, and the latch L3 is constituted of the TSPC2 P block shown in FIG. 6. The non-inverted clock input terminal CLK is connected to the clock inputs C1 and C3 of the latches L1 and L3.

Figure 18:
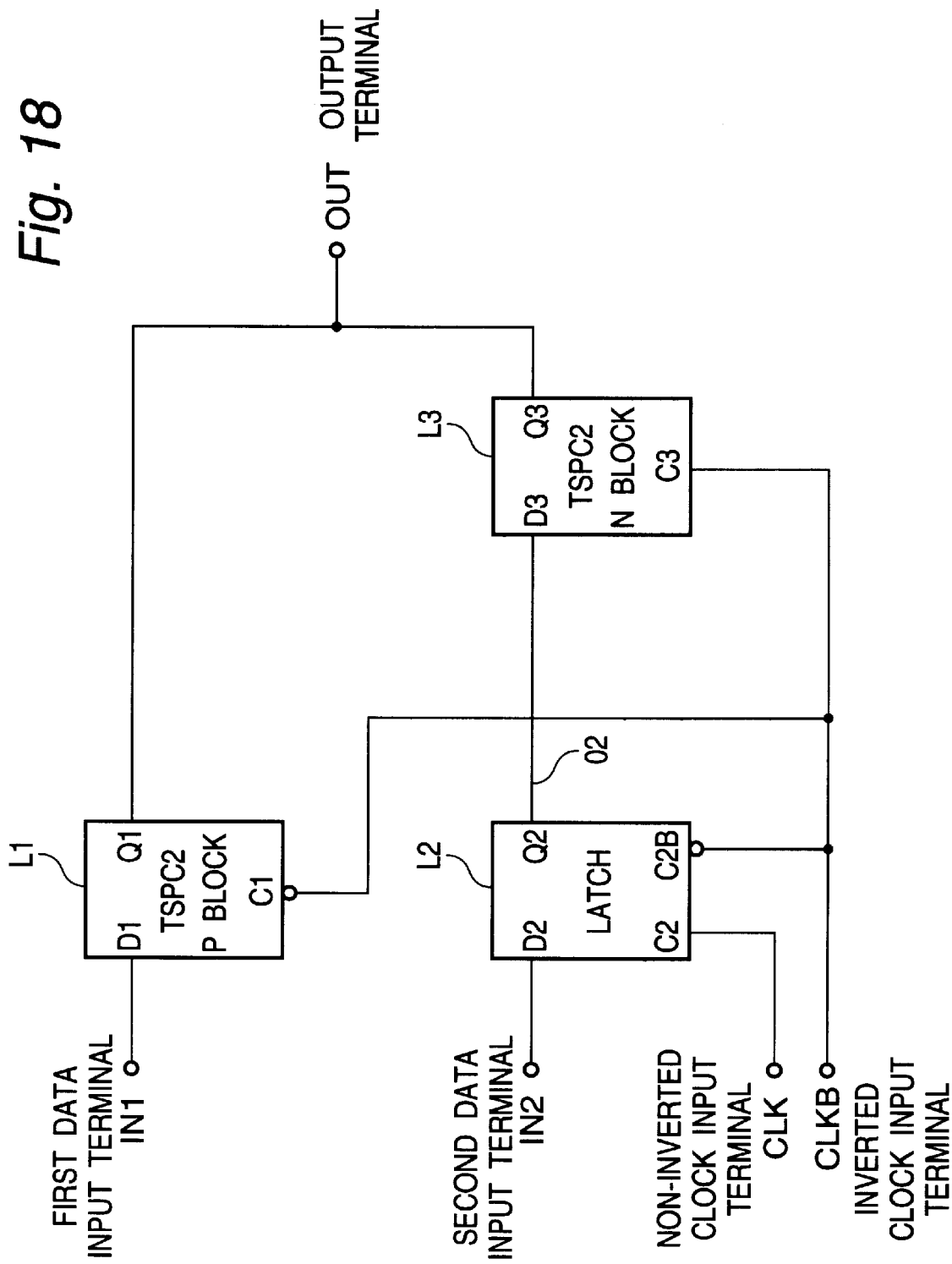
FIG. 18 is a block diagram of a twelfth embodiment of the multiplexor in accordance with the present invention.

Referring to FIG. 18, there is shown a block diagram of a twelfth embodiment of the multiplexor in accordance with the present invention.

In the multiplexor shown in FIG. 18, the latch L1 is constituted of the TSPC2 P block shown in FIG. 6, and the latch L3 is constituted of the TSPC2 N block shown in FIG. 5. The inverted clock input terminal CLKB is connected to the clock inputs C1 and C3 of the latches L1 and L3.

Figure 19:
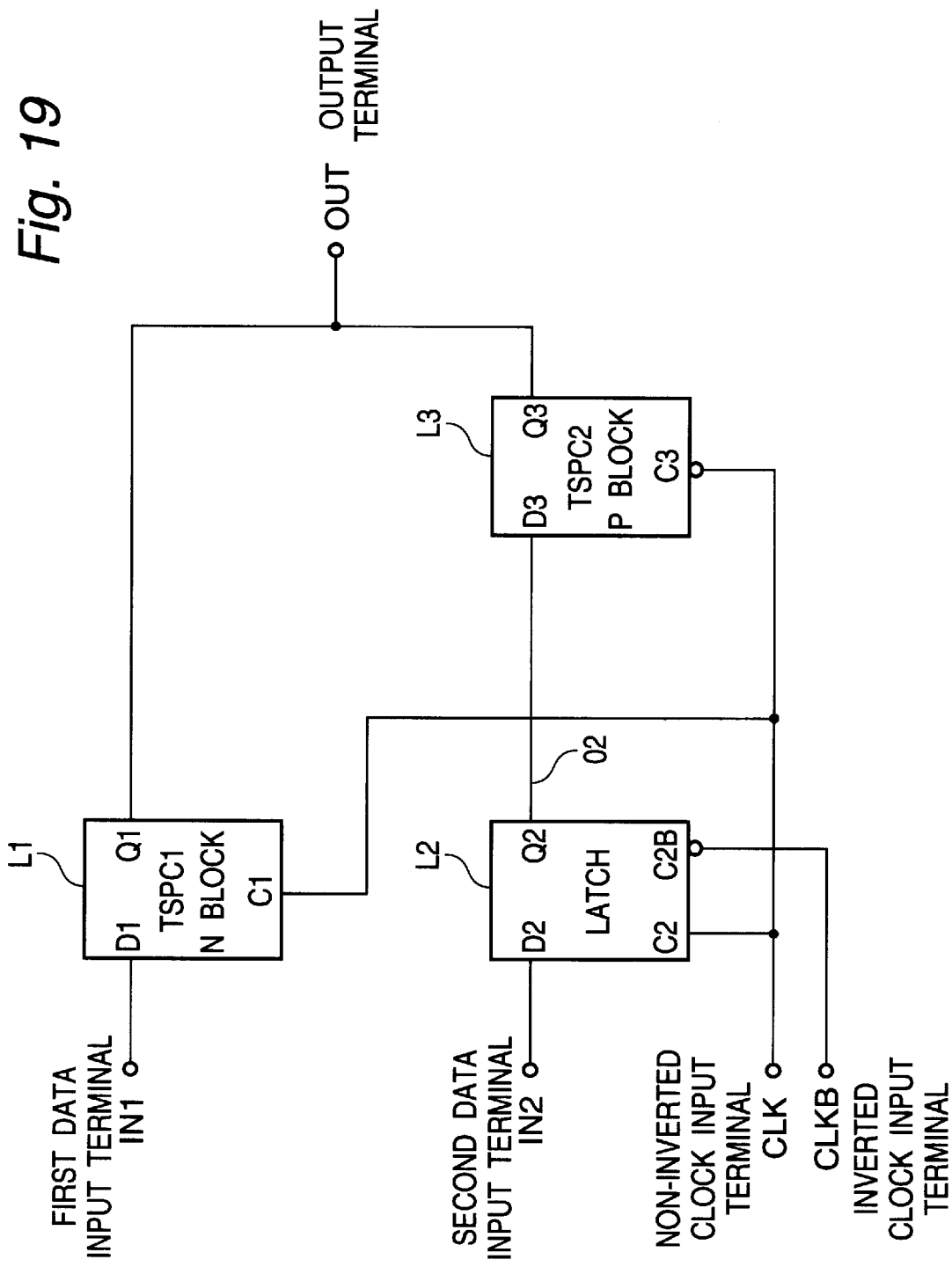
FIG. 19 is a block diagram of a thirteenth embodiment of the multiplexor in accordance with the present invention.

Referring to FIG. 19, there is shown a block diagram of a thirteenth embodiment of the multiplexor in accordance with the present invention.

In the multiplexor shown in FIG. 19, the latch L1 is constituted of the TSPC1 N block shown in FIG. 3, and the latch L3 is constituted of the TSPC2 P block shown in FIG. 6. The non-inverted clock input terminal CLK is connected to the clock inputs C1 and C3 of the latches L1 and L3.

Figure 20:
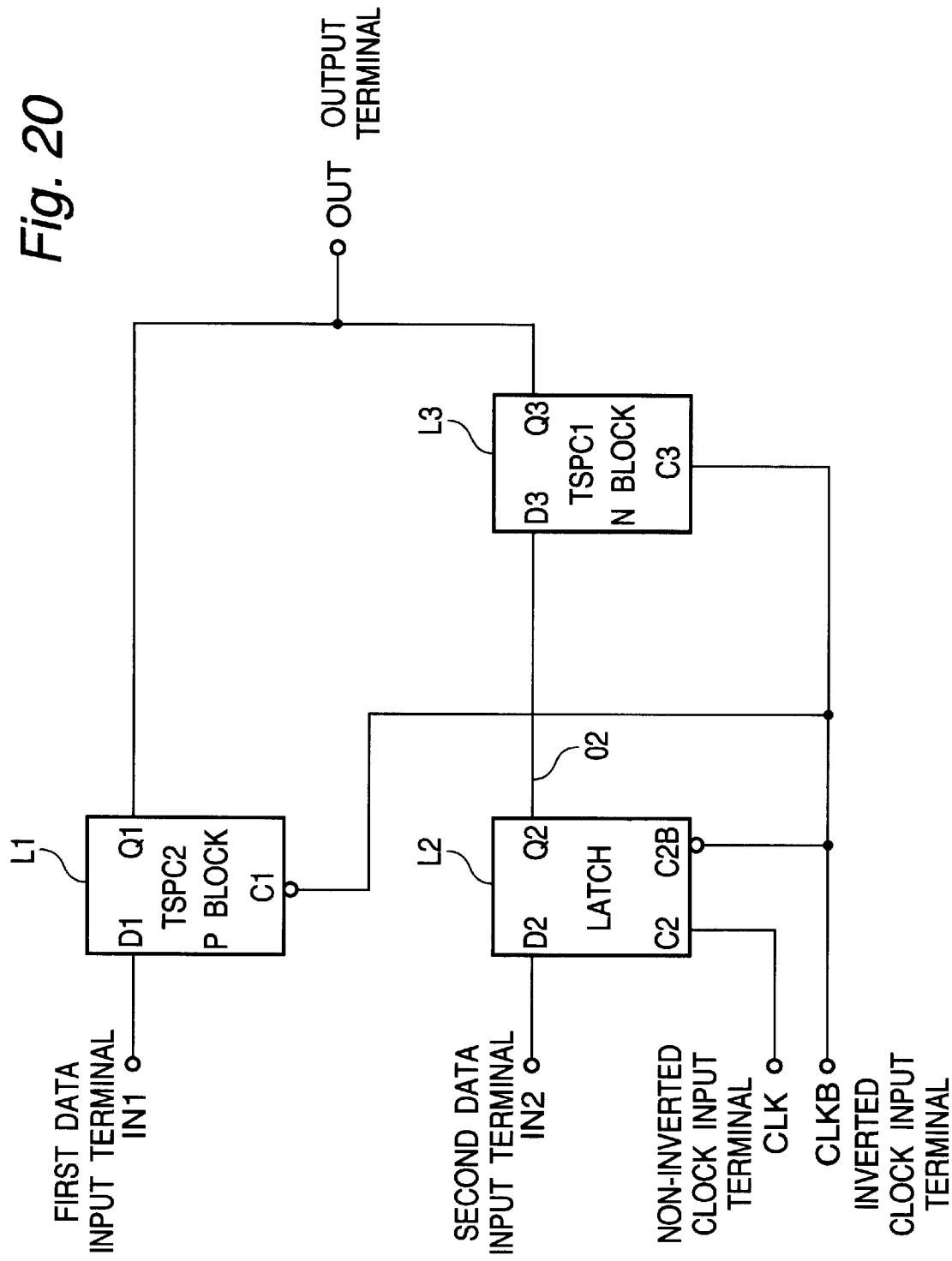
FIG. 20 is a block diagram of a fourteenth embodiment of the multiplexor in accordance with the present invention.

Referring to FIG. 20, there is shown a block diagram of a fourteenth embodiment of the multiplexor in accordance with the present invention.

In the multiplexor shown in FIG. 20, the latch L1 is constituted of the TSPC2 P block shown in FIG. 6, and the latch L3 is constituted of the TSPC1 N block shown in FIG. 3. The inverted clock input terminal CLKB is connected to the clock inputs C1 and C3 of the latches L1 and L3.

Figure 21:
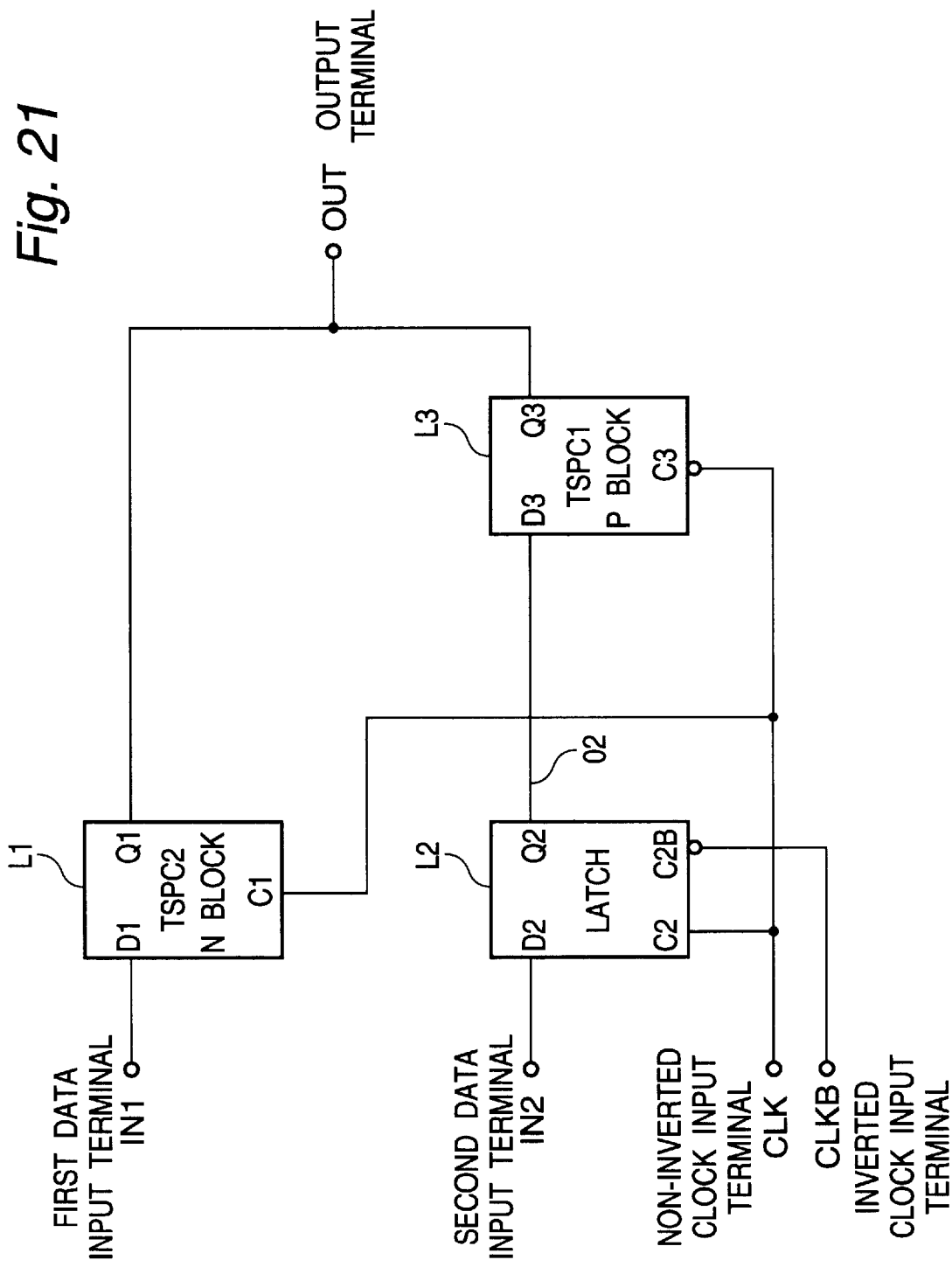
FIG. 21 is a block diagram of a fifteenth embodiment of the multiplexor in accordance with the present invention.

Referring to FIG. 21, there is shown a block diagram of a fifteenth embodiment of the multiplexor in accordance with the present invention.

In the multiplexor shown in FIG. 21, the latch L1 is constituted of the TSPC2 N block shown in FIG. 5, and the latch L3 is constituted of the TSPC1 P block shown in FIG. 4. The non-inverted clock input terminal CLK is connected to the clock inputs C1 and C3 of the latches L1 and L3.

Figure 22:
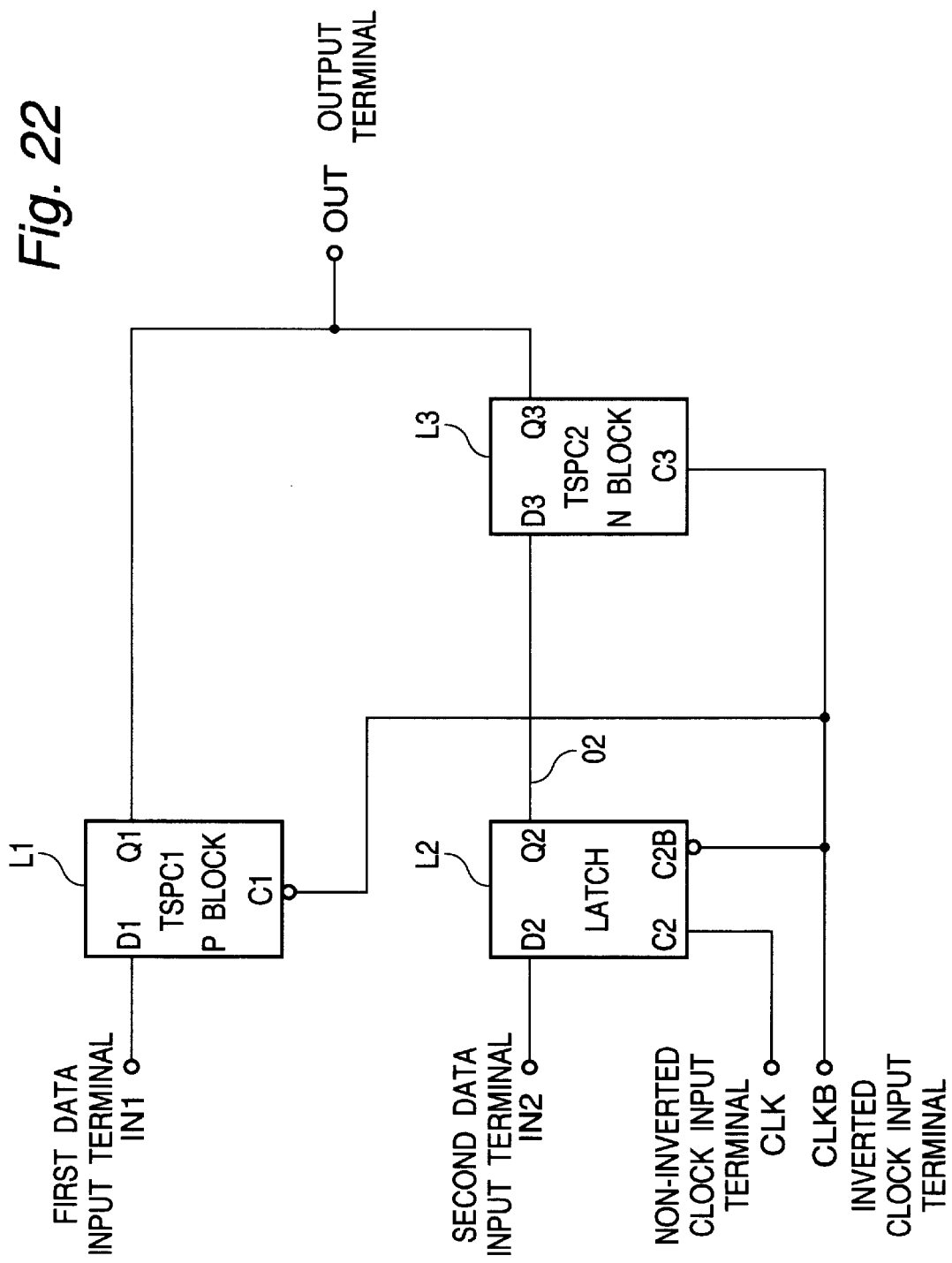
FIG. 22 is a block diagram of a sixteenth embodiment of the multiplexor in accordance with the present invention.
Figure 23:
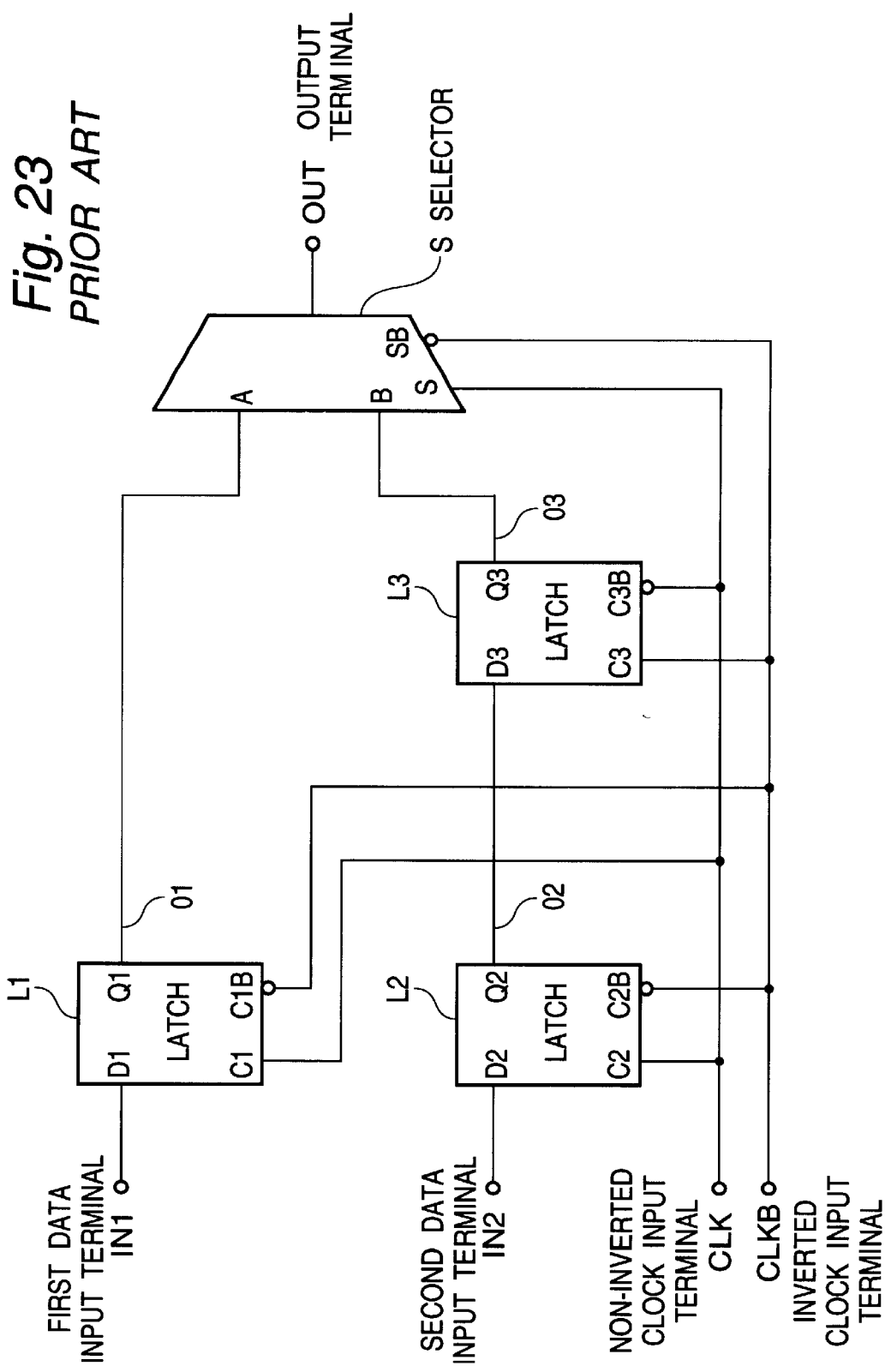
FIG. 23 is a block diagram of the basic construction for illustrating an operation principle of the prior art 2-bit multiplexor.
Figure 24:
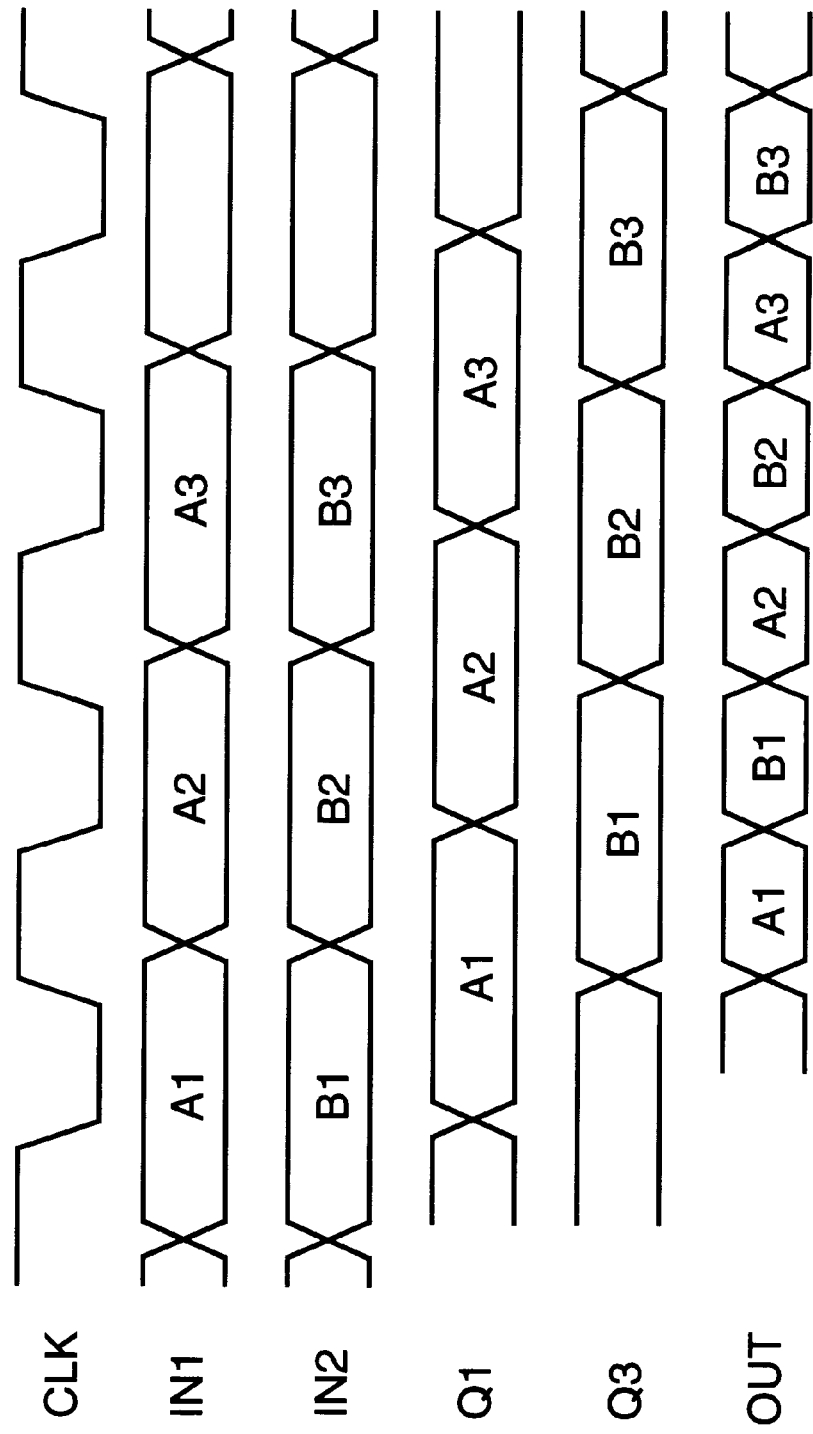
FIG. 24 is a timing chart illustrating an operation of the circuit shown in FIG. 23.

Referring to FIG. 22, there is shown a block diagram of a sixteenth embodiment of the multiplexor in accordance with the present invention.

In the multiplexor shown in FIG. 22, the latch L1 is constituted of the TSPC1 P block shown in FIG. 4, and the latch L3 is constituted of the TSPC2 N block shown in FIG. 5. The inverted clock input terminal CLKB is connected to the clock inputs C1 and C3 of the latches L1 and L3.

The circuits shown in FIGS. 7 to 22 operate similarly to the circuit having the principle construction shown in FIG. 1, and therefore, an explanation of the operation will be omitted.

Figure 25:
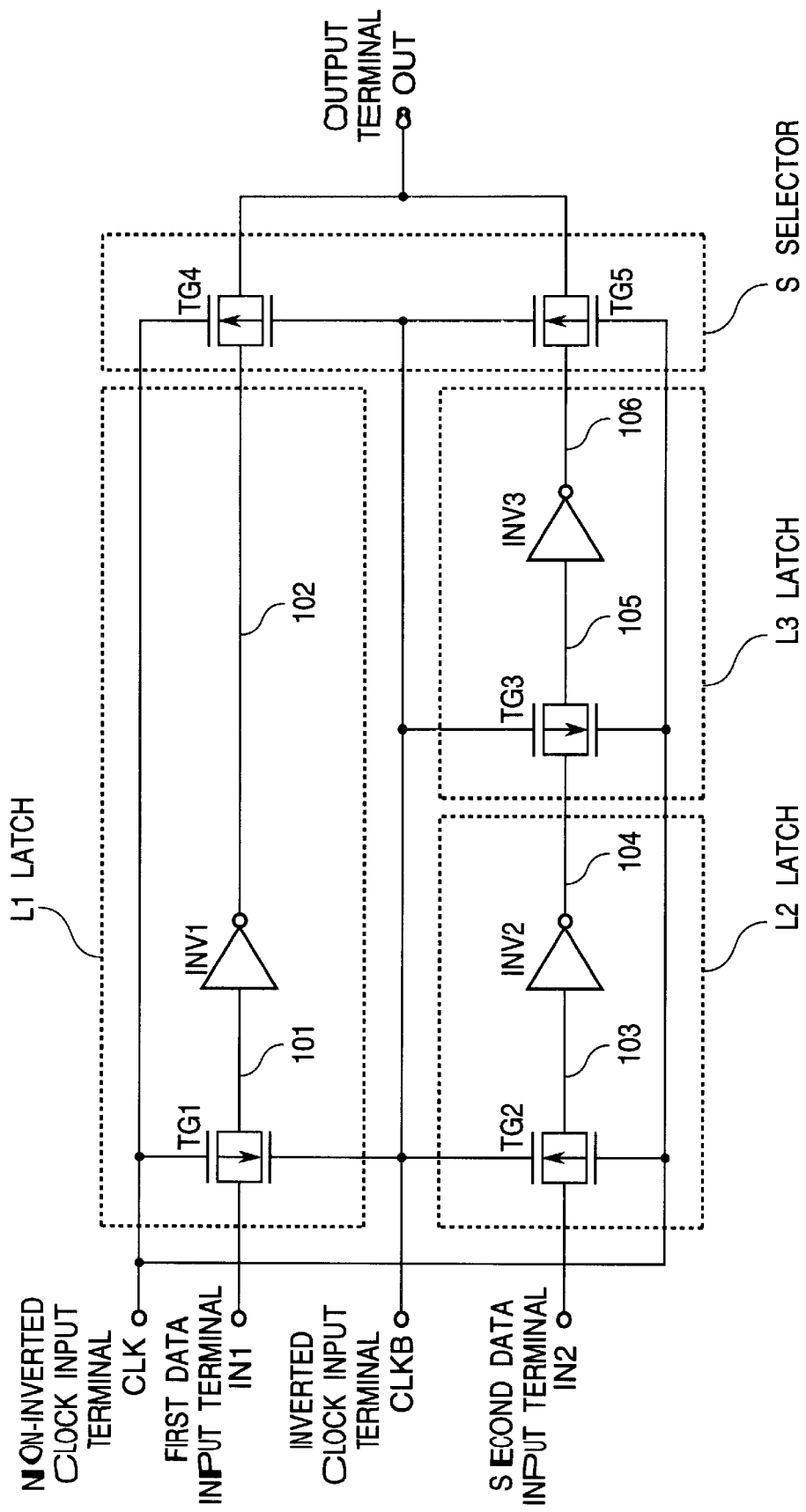
FIG. 25 is a circuit diagram illustrating of an example of the circuit construction of the prior art multiplexor shown in FIG. 23.

In the circuits shown in FIGS. 7 to 22, the number of transistors constituting the latches L1 and L3 is 12, and the number of transistors driven with the clock is 6. In the circuit shown in FIG. 25, on the other hand, the number of transistors constituting the latches L1 and L3 and the selector S is 12, and the number of transistors driven with the clock is 8. Comparing the above mentioned embodiments with the prior art multiplexor which was formed of MOS transistors and which includes the least number of circuit elements and the least number of clock driven transistors, the above mentioned embodiments are equal to the prior art multiplexor in the number of circuit elements, but is smaller than the prior art multiplexor in the number of clock driven transistors. Therefore, the load capacitance becomes small, so that the electric power consumption becomes small.

As seen from the above, the multiplexor in accordance with the present invention includes a first latch having a data input receiving a first data signal and controlled by a control signal in such a manner that when the control signal is at a high level, an output of the first latch outputs the data received at the data input, and when the control signal is at a low level, the output of the first latch becomes a dynamic node holding the value when the control signal was at the high level, and a second latch having a data input receiving a second data signal and controlled by the control signal in such a manner that when the control signal is at the low level, an output of the second latch outputs the data received at the data input, and when the control signal is at the high level, the output of the second latch becomes a dynamic node holding the value when the control signal was at the low level, the output of the first latch and the output of the second latch being connected in common in a wired connection.

With this arrangement, the selector, which was required in the prior art multiplexor, becomes unnecessary, with the result that the number of transistors driven with the control signal (for example, clock signal) can be reduced, and the electric power consumption is correspondingly reduced.

The invention has thus been shown and described with reference to the specific embodiments. However, it should be noted that the present invention is in no way limited to the details of the illustrated structures but changes and modifications may be made within the scope of the appended claims.

I claim:

1. A multiplexor comprising a first latch having a data input receiving a first data signal and controlled by a control signal in such a manner that when said control signal is at a first logical level, an output of said first latch outputs the data received at said data input of said first latch, and when said control signal is at a second logical level opposite to said first logical level, said output of said first latch becomes a dynamic node holding a last value of said output of said first latch when said control signal was at said first logical level, and a second latch having a data input receiving a second data signal and controlled by said control signal in such a manner that when said control signal is at said second logical level, an output of said second latch outputs the data received at said data input of said second latch, and when said control signal is at said first logical level, said output of said second latch becomes a dynamic node holding a last value of said output of said second latch when said control signal was at said second logical level, said output of said first latch and said output of said second latch being connected to each other in a wired connection.

2. A multiplexor claimed in claim 1 further including a first data input terminal, a second data input terminal, a first control terminal for receiving said control signal, a second control terminal for receiving an inverted control signal having the phase opposite to that of said control signal supplied to said first control terminal, a first power supply terminal, a second power supply terminal, and an output terminal, and wherein said first latch includes
a first-channel-conductivity type MOS transistor having a source connected to said first power supply terminal, a drain connected to a first node, and a gate connected to said first control terminal;
a second-channel-conductivity type MOS transistor having a source connected to said second power supply terminal, a drain connected to a second node, and a gate connected to said first control terminal;
a second-channel-conductivity type MOS transistor having a source connected to said second node, a drain connected to said first node, and a gate connected to said first data input terminal;
a first-channel-conductivity type MOS transistor having a source connected to said first power supply terminal, a drain connected to said output terminal, and a gate connected to said first node;
a second-channel-conductivity type MOS transistor having a source connected to said second power supply terminal, a drain connected to a third node, and a gate connected to said first node; and
a second-channel-conductivity type MOS transistor having a source connected to said third node, a drain connected to said output terminal, and a gate connected to said first control terminal; and
wherein said second latch includes
a first-channel-conductivity type MOS transistor having a source connected to said first power supply terminal, a drain connected to a fourth node, and a gate connected to said second control terminal;
a second-channel-conductivity type MOS transistor having a source connected to said second power supply terminal, a drain connected to a fifth node, and a gate connected to said second control terminal;
a second-channel-conductivity type MOS transistor having a source connected to said fifth node, a drain connected to said fourth node, and a gate connected to said second data input terminal;
a first-channel-conductivity type MOS transistor having a source connected to said first power supply terminal, a drain connected to said output terminal, and a gate connected to said fourth node;
a second-channel-conductivity type MOS transistor having a source connected to said second power supply terminal, a drain connected to a sixth node, and a gate connected to said fourth node; and a second-channel-conductivity type MOS transistor having a source connected to said sixth node, a drain connected to said output terminal, and a gate connected to said second control terminal.

3. A multiplexor claimed in claim 1 further including a first data input terminal, a second data input terminal, a first control terminal for receiving said control signal, a second control terminal for receiving an inverted control signal having the phase opposite to that of said control signal supplied to said first control terminal, a first power supply terminal, a second power supply terminal, and an output terminal, and wherein said first latch includes
- a first-channel-conductivity type MOS transistor having a source connected to said first power supply terminal, a drain connected to a first node, and a gate connected to said first control terminal;
- a second-channel-conductivity type MOS transistor having a source connected to said second power supply terminal, a drain connected to a second node, and a gate connected to said first control terminal;
- a second-channel-conductivity type MOS transistor having a source connected to said second node, a drain connected to said first node, and a gate connected to said first data input terminal;
- a first-channel-conductivity type MOS transistor having a source connected to said first power supply terminal, a drain connected to said output terminal, and a gate connected to said first node;
- a second-channel-conductivity type MOS transistor having a source connected to said second node, a drain connected to a third node, and a gate connected to said first node; and
- a second-channel-conductivity type MOS transistor having a source connected to said third node, a drain connected to said output terminal, and a gate connected to said first control terminal; and wherein said second latch includes
- a first-channel-conductivity type MOS transistor having a source connected to said first power supply terminal, a drain connected to a fourth node, and a gate connected to said second control terminal;
- a second-channel-conductivity type MOS transistor having a source connected to said second power supply terminal, a drain connected to a fifth node, and a gate connected to said second control terminal;
- a second-channel-conductivity type MOS transistor having a source connected to said fifth node, a drain connected to said fourth node, and a gate connected to said second data input terminal;
- a first-channel-conductivity type MOS transistor having a source connected to said first power supply terminal, a drain connected to said output terminal, and a gate connected to said fourth node;
- a second-channel-conductivity type MOS transistor having a source connected to said fifth node, a drain connected to a sixth node, and a gate connected to said fourth node; and
- a second-channel-conductivity type MOS transistor having a source connected to said sixth node, a drain connected to said output terminal, and a gate connected to said second control terminal.

4. A multiplexor claimed in claim 1 further including a first data input terminal, a second data input terminal, a first control terminal for receiving said control signal, a second control terminal for receiving an inverted control signal having the phase opposite to that of said control signal supplied to said first control terminal, a first power supply terminal, a second power supply terminal, and an output terminal; and wherein said first latch includes
- a first-channel-conductivity type MOS transistor having a source connected to said first power supply terminal, a drain connected to a first node, and a gate connected to said first control terminal;
- a second-channel-conductivity type MOS transistor having a source connected to said second power supply terminal, a drain connected to a second node, and a gate connected to said first control terminal;
- a second-channel-conductivity type MOS transistor having a source connected to said second node, a drain connected to said first node, and a gate connected to said first data input terminal;
- a first-channel-conductivity type MOS transistor having a source connected to said first power supply terminal, a drain connected to said output terminal, and a gate connected to said first node;
- a second-channel-conductivity type MOS transistor having a source connected to said second power supply terminal, a drain connected to a third node, and a gate connected to said first node; and
- a second-channel-conductivity type MOS transistor having a source connected to said third node, a drain connected to said output terminal, and a gate connected to said first control terminal; and wherein said second latch includes
- a first-channel-conductivity type MOS transistor having a source connected to said first power supply terminal, a drain connected to a fourth node, and a gate connected to said second control terminal;
- a second-channel-conductivity type MOS transistor having a source connected to said second power supply terminal, a drain connected to a fifth node, and a gate connected to said second control terminal;
- a second-channel-conductivity type MOS transistor having a source connected to said fifth node, a drain connected to said fourth node, and a gate connected to said second data input terminal;
- a first-channel-conductivity type MOS transistor having a source connected to said first power supply terminal, a drain connected to said output terminal, and a gate connected to said fourth node;
- a second-channel-conductivity type MOS transistor having a source connected to said fifth node, a drain connected to a sixth node, and a gate connected to said fourth node; and
- a second-channel-conductivity type MOS transistor having a source connected to said sixth node, a drain connected to said output terminal, and a gate connected to said second control terminal.

5. A multiplexor claimed in claim 1 further including a first data input terminal, a second data input terminal, a first control terminal for receiving said control signal, a second control terminal for receiving an inverted control signal having the phase opposite to that of said control signal supplied to said first control terminal, a first power supply terminal, a second power supply terminal, and an output terminal, and wherein said first latch includes
- a first-channel-conductivity type MOS transistor having a source connected to said first power supply terminal, a drain connected to a second node, and a gate connected to said first control terminal;

a first-channel-conductivity type MOS transistor having a source connected to said second node, a drain connected to a first node, and a gate connected to said first data input terminal;

a second-channel-conductivity type MOS transistor having a source connected to said second power supply terminal, a drain connected to said first node, and a gate connected to said first control terminal;

a first-channel-conductivity type MOS transistor having a source connected to said first power supply terminal, a drain connected to a third node, and a gate connected to said first node;

a first-channel-conductivity type MOS transistor having a source connected to said third node, a drain connected to said output terminal, and a gate connected to said first control terminal; and a second-channel-conductivity type MOS transistor having a source connected to said second power supply terminal, a drain connected to said output terminal, and a gate connected to said first node; and wherein said second latch includes a first-channel-conductivity type MOS transistor having a source connected to said first power supply terminal, a drain connected to a fifth node, and a gate connected to said second control terminal;

a first-channel-conductivity type MOS transistor having a source connected to said fifth node, a drain connected to a fourth node, and a gate connected to said second data input terminal;

a second-channel-conductivity type MOS transistor having a source connected to said second power supply terminal, a drain connected to said fourth node, and a gate connected to said second control terminal;

a first-channel-conductivity type MOS transistor having a source connected to said first power supply terminal, a drain connected to a sixth node, and a gate connected to said fourth node;

a first-channel-conductivity type MOS transistor having a source connected to said sixth node, a drain connected to said output terminal, and a gate connected to said second control terminal; and a second-channel-conductivity type MOS transistor having a source connected to said second power supply terminal, a drain connected to said output terminal, and a gate connected to said fourth node.

6. A multiplexor claimed in claim 1 further including a first data input terminal, a second data input terminal, a first control terminal for receiving said control signal, a second control terminal for receiving an inverted control signal having the phase opposite to that of said control signal supplied to said first control terminal, a first power supply terminal, a second power supply terminal, and an output terminal, and wherein said first latch includes a first-channel-conductivity type MOS transistor having a source connected to said first power supply terminal, a drain connected to a second node, and a gate connected to said first control terminal;

a first-channel-conductivity type MOS transistor having a source connected to said second node, a drain connected to a first node, and a gate connected to said first data input terminal;

a second-channel-conductivity type MOS transistor having a source connected to said second power supply terminal, a drain connected to said first node, and a gate connected to said first control terminal;

a first-channel-conductivity type MOS transistor having a source connected to said second node, a drain connected to a third node, and a gate connected to said first node;

a first-channel-conductivity type MOS transistor having a source connected to said third node, a drain connected to said output terminal, and a gate connected to said first control terminal; and a second-channel-conductivity type MOS transistor having a source connected to said second power supply terminal, a drain connected to said output terminal, and a gate connected to said first node; and wherein said second latch includes a first-channel-conductivity type MOS transistor having a source connected to said first power supply terminal, a drain connected to a fifth node, and a gate connected to said second control terminal;

a first-channel-conductivity type MOS transistor having a source connected to said fifth node, a drain connected to a fourth node, and a gate connected to said second data input terminal;

a second-channel-conductivity type MOS transistor having a source connected to said second power supply terminal, a drain connected to said fourth node, and a gate connected to said second control terminal;

a first-channel-conductivity type MOS transistor having a source connected to said fifth node, a drain connected to a sixth node, and a gate connected to said fourth node;

a first-channel-conductivity type MOS transistor having a source connected to said sixth node, a drain connected to said output terminal, and a gate connected to said second control terminal; and a second-channel-conductivity type MOS transistor having a source connected to said second power supply terminal, a drain connected to said output terminal, and a gate connected to said fourth node.

7. A multiplexor claimed in claim 1 further including a first data input terminal, a second data input terminal, a first control terminal for receiving said control signal, a second control terminal for receiving an inverted control signal having the phase opposite to that of said control signal supplied to said first control terminal, a first power supply terminal, a second power supply terminal, and an output terminal, and wherein said first latch includes a first-channel-conductivity type MOS transistor having a source connected to said first power supply terminal, a drain connected to a second node, and a gate connected to said first control terminal;

a first-channel-conductivity type MOS transistor having a source connected to said second node, a drain connected to a first node, and a gate connected to said first data input terminal;

a second-channel-conductivity type MOS transistor having a source connected to said second power supply terminal, a drain connected to said first node, and a gate connected to said first control terminal;

a first-channel-conductivity type MOS transistor having a source connected to said first power supply terminal, a drain connected to a third node, and a gate connected to said first node;

a first-channel-conductivity type MOS transistor having a source connected to said third node, a drain connected to said output terminal, and a gate connected to said first control terminal; and a second-channel-conductivity type MOS transistor having a source connected to said second power supply terminal, a drain connected to said output terminal, and a gate connected to said first node; and wherein said second latch includes
a first-channel-conductivity type MOS transistor having a source connected to said first power supply terminal, a drain connected to a fifth node, and a gate connected to said second control terminal;
a first-channel-conductivity type MOS transistor having a source connected to said fifth node, a drain connected to a fourth node, and a gate connected to said second data input terminal;
a second-channel-conductivity type MOS transistor having a source connected to said second power supply terminal, a drain connected to said fourth node, and a gate connected to said second control terminal;
a first-channel-conductivity type MOS transistor having a source connected to said fifth node, a drain connected to a sixth node, and a gate connected to said fourth node;
a first-channel-conductivity type MOS transistor having a source connected to said sixth node, a drain connected to said output terminal, and a gate connected to said second control terminal; and
a second-channel-conductivity type MOS transistor having a source connected to said second power supply terminal, a drain connected to said output terminal, and a gate connected to said fourth node.

8. A multiplexor claimed in claim 1 further including a first data input terminal, a second data input terminal, a control terminal for receiving said control signal, a first power supply terminal, a second power supply terminal, and an output terminal, and wherein said first latch includes
a first-channel-conductivity type MOS transistor having a source connected to said first power supply terminal, a drain connected to a first node, and a gate connected to said control terminal;
a second-channel-conductivity type MOS transistor having a source connected to said second power supply terminal, a drain connected to a second node, and a gate connected to said control terminal;
a second-channel-conductivity type MOS transistor having a source connected to said second node, a drain connected to said first node, and a gate connected to said first data input terminal;
a first-channel-conductivity type MOS transistor having a source connected to said first power supply terminal, a drain connected to said output terminal, and a gate connected to said first node;
a second-channel-conductivity type MOS transistor having a source connected to said second power supply terminal, a drain connected to a third node, and a gate connected to said first node; and
a second-channel-conductivity type MOS transistor having a source connected to said third node, a drain connected to said output terminal, and a gate connected to said control terminal; and wherein said second latch includes
a first-channel-conductivity type MOS transistor having a source connected to said first power supply terminal, a drain connected to a fifth node, and a gate connected to said control terminal;
a first-channel-conductivity type MOS transistor having a source connected to said fifth node, a drain connected to a fourth node, and a gate connected to said second data input terminal;
a second-channel-conductivity type MOS transistor having a source connected to said second power supply terminal, a drain connected to said fourth node, and a gate connected to said control terminal;
a first-channel-conductivity type MOS transistor having a source connected to said first power supply terminal, a drain connected to a sixth node, and a gate connected to said fourth node;
a first-channel-conductivity type MOS transistor having a source connected to said sixth node, a drain connected to said output terminal, and a gate connected to said control terminal; and
a second-channel-conductivity type MOS transistor having a source connected to said second power supply terminal, a drain connected to said output terminal, and a gate connected to said fourth node.

9. A multiplexor claimed in claim 1 further including a first data input terminal, a second data input terminal, a control terminal for receiving said control signal, a first power supply terminal, a second power supply terminal, and an output terminal, and wherein said first latch includes
a first-channel-conductivity type MOS transistor having a source connected to said first power supply terminal, a drain connected to a first node, and a gate connected to said control terminal;
a second-channel-conductivity type MOS transistor having a source connected to said second power supply terminal, a drain connected to a second node, and a gate connected to said control terminal;
a second-channel-conductivity type MOS transistor having a source connected to said second node, a drain connected to said first node, and a gate connected to said first data input terminal;
a first-channel-conductivity type MOS transistor having a source connected to said first power supply terminal, a drain connected to said output terminal, and a gate connected to said first node;
a second-channel-conductivity type MOS transistor having a source connected to said second node, a drain connected to a third node, and a gate connected to said first node; and
a second-channel-conductivity type MOS transistor having a source connected to said third node, a drain connected to said output terminal, and a gate connected to said control terminal; and wherein said second latch includes
a first-channel-conductivity type MOS transistor having a source connected to said first power supply terminal, a drain connected to a fifth node, and a gate connected to said control terminal;
a first-channel-conductivity type MOS transistor having a source connected to said fifth node, a drain connected to a fourth node, and a gate connected to said second data input terminal;
a second-channel-conductivity type MOS transistor having a source connected to said second power supply terminal, a drain connected to said fourth node, and a gate connected to said control terminal;
a first-channel-conductivity type MOS transistor having a source connected to said fifth node, a drain connected to a sixth node, and a gate connected to said fourth node;
a first-channel-conductivity type MOS transistor having a source connected to said sixth node, a drain connected to said output terminal, and a gate connected to said control terminal; and
a second-channel-conductivity type MOS transistor having a source connected to said second power supply terminal, a drain connected to said output terminal, and a gate connected to said fourth node.

10. A multiplexor claimed in claim 1 further including a first data input terminal, a second data input terminal, a control terminal for receiving said control signal, a first power supply terminal, a second power supply terminal, and an output terminal, and
wherein said first latch includes
a first-channel-conductivity type MOS transistor having a source connected to said first power supply terminal, a drain connected to a first node, and a gate connected to said control terminal;
a second-channel-conductivity type MOS transistor having a source connected to said second power supply terminal, a drain connected to a second node, and a gate connected to said control terminal;
a second-channel-conductivity type MOS transistor having a source connected to said second node, a drain connected to said first node, and a gate connected to said first data input terminal;
a first-channel-conductivity type MOS transistor having a source connected to said first power supply terminal, a drain connected to said output terminal, and a gate connected to said first node;
a second-channel-conductivity type MOS transistor having a source connected to said second power supply terminal, a drain connected to a third node, and a gate connected to said first node; and
a second-channel-conductivity type MOS transistor having a source connected to said third node, a drain connected to said output terminal, and a gate connected to said control terminal; and
wherein said second latch includes
a first-channel-conductivity type MOS transistor having a source connected to said first power supply terminal, a drain connected to a fifth node, and a gate connected to said control terminal;
a first-channel-conductivity type MOS transistor having a source connected to said fifth node, a drain connected to a fourth node, and a gate connected to said second data input terminal;
a second-channel-conductivity type MOS transistor having a source connected to said second power supply terminal, a drain connected to said fourth node, and a gate connected to said control terminal;
a first-channel-conductivity type MOS transistor having a source connected to said fifth node, a drain connected to a sixth node, and a gate connected to said fourth node;
a first-channel-conductivity type MOS transistor having a source connected to said sixth node, a drain connected to said output terminal, and a gate connected to said control terminal; and
a second-channel-conductivity type MOS transistor having a source connected to said second power supply terminal, a drain connected to said output terminal, and a gate connected to said fourth node.

11. A multiplexor claimed in claim 1 further including a first data input terminal, a second data input terminal, a control terminal for receiving said control signal, a first power supply terminal, a second power supply terminal, and an output terminal, and
wherein said first latch includes
a first-channel-conductivity type MOS transistor having a source connected to said first power supply terminal, a drain connected to a first node, and a gate connected to said control terminal;
a second-channel-conductivity type MOS transistor having a source connected to said second power supply terminal, a drain connected to a second node, and a gate connected to said control terminal;
a second-channel-conductivity type MOS transistor having a source connected to said second node, a drain connected to said first node, and a gate connected to said first data input terminal;
a first-channel-conductivity type MOS transistor having a source connected to said first power supply terminal, a drain connected to said output terminal, and a gate connected to said first node;
a second-channel-conductivity type MOS transistor having a source connected to said second node, a drain connected to a third node, and a gate connected to said first node; and
a second-channel-conductivity type MOS transistor having a source connected to said third node, a drain connected to said output terminal, and a gate connected to said control terminal; and
wherein said second latch includes
a first-channel-conductivity type MOS transistor having a source connected to said first power supply terminal, a drain connected to a fifth node, and a gate connected to said control terminal;
a first-channel-conductivity type MOS transistor having a source connected to said fifth node, a drain connected to a fourth node, and a gate connected to said second data input terminal;
a second-channel-conductivity type MOS transistor having a source connected to said second power supply terminal, a drain connected to said fourth node, and a gate connected to said control terminal;
a first-channel-conductivity type MOS transistor having a source connected to said first power supply terminal, a drain connected to a sixth node, and a gate connected to said fourth node;
a first-channel-conductivity type MOS transistor having a source connected to said sixth node, a drain connected to said output terminal, and a gate connected to said control terminal; and
a second-channel-conductivity type MOS transistor having a source connected to said second power supply terminal, a drain connected to said output terminal, and a gate connected to said fourth node.

12. A multiplexor claimed in claim 1 further including a first data input terminal, a second data input terminal, a first control terminal for receiving said control signal, a second control terminal for receiving an inverted control signal having the phase opposite to that of said control signal supplied to said first control terminal, a first power supply terminal, a second power supply terminal, and an output terminal, and
wherein said first latch includes
a first-channel-conductivity type MOS transistor having a source connected to said first power supply terminal, a drain connected to a first node, and a gate connected to said first control terminal;
a second-channel-conductivity type MOS transistor having a source connected to said second power supply terminal, a drain connected to a second node, and a gate connected to said first control terminal;
a second-channel-conductivity type MOS transistor having a source connected to said second node, a drain connected to said first node, and a gate connected to said first data input terminal;

a first-channel-conductivity type MOS transistor having a source connected to said first power supply terminal, a drain connected to said output terminal, and a gate connected to said first node;

a second-channel-conductivity type MOS transistor having a source connected to said second node, a drain connected to a third node, and a gate connected to said first node; and a second-channel-conductivity type MOS transistor having a source connected to said third node, a drain connected to said output terminal, and a gate connected to said first control terminal; and wherein said second latch includes a first-channel-conductivity type MOS transistor having a source connected to said first power supply terminal, a drain connected to a fourth node, and a gate connected to said second control terminal;

a second-channel-conductivity type MOS transistor having a source connected to said second power supply terminal, a drain connected to a fifth node, and a gate connected to said second control terminal;

a second-channel-conductivity type MOS transistor having a source connected to said fifth node, a drain connected to said fourth node, and a gate connected to said second data input terminal;

a first-channel-conductivity type MOS transistor having a source connected to said first power supply terminal, a drain connected to said output terminal, and a gate connected to said fourth node;

a second-channel-conductivity type MOS transistor having a source connected to said second power supply terminal, a drain connected to a sixth node, and a gate connected to said fourth node; and a second-channel-conductivity type MOS transistor having a source connected to said sixth node, a drain connected to said output terminal, and a gate connected to said second control terminal.

13. A multiplexor claimed in claim 1 further including a first data input terminal, a second data input terminal, a first control terminal for receiving said control signal, a second control terminal for receiving an inverted control signal having the phase opposite to that of said control signal supplied to said first control terminal, a first power supply terminal, a second power supply terminal, and an output terminal, and wherein said first latch includes a first-channel-conductivity type MOS transistor having a source connected to said first power supply terminal, a drain connected to a second node, and a gate connected to said first control terminal;

a first-channel-conductivity type MOS transistor having a source connected to said second node, a drain connected to a first node, and a gate connected to said first data input terminal;

a second-channel-conductivity type MOS transistor having a source connected to said second power supply terminal, a drain connected to said first node, and a gate connected to said first control terminal;

a first-channel-conductivity type MOS transistor having a source connected to said second node, a drain connected to a third node, and a gate connected to said first node;

a first-channel-conductivity type MOS transistor having a source connected to said third node, a drain connected to said output terminal, and a gate connected to said first control terminal; and a second-channel-conductivity type MOS transistor having a source connected to said second power supply terminal, a drain connected to said output terminal, and a gate connected to said first node; and wherein said second latch includes a first-channel-conductivity type MOS transistor having a source connected to said first power supply terminal, a drain connected to a fifth node, and a gate connected to said second control terminal;

a first-channel-conductivity type MOS transistor having a source connected to said fifth node, a drain connected to a fourth node, and a gate connected to said second data input terminal;

a second-channel-conductivity type MOS transistor having a source connected to said second power supply terminal, a drain connected to said fourth node, and a gate connected to said second control terminal;

a first-channel-conductivity type MOS transistor having a source connected to said first power supply terminal, a drain connected to a sixth node, and a gate connected to said fourth node ;

a first-channel-conductivity type MOS transistor having a source connected to said sixth node, a drain connected to said output terminal, and a gate connected to said second control terminal; and a second-channel-conductivity type MOS transistor having a source connected to said second power supply terminal, a drain connected to said output terminal, and a gate connected to said fourth node.

14. A multiplexor claimed in claim 1 further including a first data input terminal, a second data input terminal, a control terminal for receiving said control signal, a first power supply terminal, a second power supply terminal, and an output terminal, and wherein said first latch includes a first-channel-conductivity type MOS transistor having a source connected to said first power supply terminal, a drain connected to a second node, and a gate connected to said control terminal;

a first-channel-conductivity type MOS transistor having a source connected to said second node, a drain connected to a first node, and a gate connected to said first data input terminal;

a second-channel-conductivity type MOS transistor having a source connected to said second power supply terminal, a drain connected to said first node, and a gate connected to said control terminal;

a first-channel-conductivity type MOS transistor having a source connected to said first power supply terminal, a drain connected to a third node, and a gate connected to said first node;

a first-channel-conductivity type MOS transistor having a source connected to said third node, a drain connected to said output terminal, and a gate connected to said control terminal; and a second-channel-conductivity type MOS transistor having a source connected to said second power supply terminal, a drain connected to said output terminal, and a gate connected to said first node; and wherein said second latch includes a first-channel-conductivity type MOS transistor having a source connected to said first power supply terminal, a drain connected to a fourth node, and a gate connected to said control terminal;

a second-channel-conductivity type MOS transistor having a source connected to said second power supply terminal, a drain connected to a fifth node, and a gate connected to said control terminal;

a second-channel-conductivity type MOS transistor having a source connected to said fifth node, a drain connected to said fourth node, and a gate connected to said second data input terminal;

a first-channel-conductivity type MOS transistor having a source connected to said first power supply terminal, a drain connected to said output terminal, and a gate connected to said fourth node;

a second-channel-conductivity type MOS transistor having a source connected to said second power supply terminal, a drain connected to a sixth node, and a gate connected to said fourth node; and a second-channel-conductivity type MOS transistor having a source connected to said sixth node, a drain connected to said output terminal, and a gate connected to said control terminal.

15. A multiplexor claimed in claim 1 further including a first data input terminal, a second data input terminal, a control terminal for receiving said control signal, a first power supply terminal, a second power supply terminal, and an output terminal, and wherein said first latch includes a first-channel-conductivity type MOS transistor having a source connected to said first power supply terminal, a drain connected to a second node, and a gate connected to said control terminal;

a first-channel-conductivity type MOS transistor having a source connected to said second node, a drain connected to a first node, and a gate connected to said first data input terminal;

a second-channel-conductivity type MOS transistor having a source connected to said second power supply terminal, a drain connected to said first node, and a gate connected to said control terminal;

a first-channel-conductivity type MOS transistor having a source connected to said second node, a drain connected to a third node, and a gate connected to said first node;

a first-channel-conductivity type MOS transistor having a source connected to said third node, a drain connected to said output terminal, and a gate connected to said control terminal; and a second-channel-conductivity type MOS transistor having a source connected to said second power supply terminal, a drain connected to said output terminal, and a gate connected to said first node; and wherein said second latch includes a first-channel-conductivity type MOS transistor having a source connected to said first power supply terminal, a drain connected to a fourth node, and a gate connected to said control terminal;

a second-channel-conductivity type MOS transistor having a source connected to said second power supply terminal, a drain connected to a fifth node, and a gate connected to said control terminal;

a second-channel-conductivity type MOS transistor having a source connected to said fifth node, a drain connected to said fourth node, and a gate connected to said second data input terminal;

a first-channel-conductivity type MOS transistor having a source connected to said first power supply terminal, a drain connected to said output terminal, and a gate connected to said fourth node;

a second-channel-conductivity type MOS transistor having a source connected to said fifth node, a drain connected to a sixth node, and a gate connected to said fourth node; and a second-channel-conductivity type MOS transistor having a source connected to said sixth node, a drain connected to said output terminal, and a gate connected to said control terminal.

16. A multiplexor claimed in claim 1 further including a first data input terminal, a second data input terminal, a control terminal for receiving said control signal, a first power supply terminal, a second power supply terminal, and an output terminal, and wherein said first latch includes a first-channel-conductivity type MOS transistor having a source connected to said first power supply terminal, a drain connected to a second node, and a gate connected to said control terminal;

a first-channel-conductivity type MOS transistor having a source connected to said second node, a drain connected to a first node, and a gate connected to said first data input terminal;

a second-channel-conductivity type MOS transistor having a source connected to said second power supply terminal, a drain connected to said first node, and a gate connected to said control terminal;

a first-channel-conductivity type MOS transistor having a source connected to said second node, a drain connected to a third node, and a gate connected to said first node;

a first-channel-conductivity type MOS transistor having a source connected to said third node, a drain connected to said output terminal, and a gate connected to said control terminal; and a second-channel-conductivity type MOS transistor having a source connected to said second power supply terminal, a drain connected to said output terminal, and a gate connected to said first node; and wherein said second latch includes a first-channel-conductivity type MOS transistor having a source connected to said first power supply terminal, a drain connected to a fourth node, and a gate connected to said control terminal;

a second-channel-conductivity type MOS transistor having a source connected to said second power supply terminal, a drain connected to a fifth node, and a gate connected to said control terminal;

a second-channel-conductivity type MOS transistor having a source connected to said fifth node, a drain connected to said fourth node, and a gate connected to said second data input terminal;

a first-channel-conductivity type MOS transistor having a source connected to said first power supply terminal, a drain connected to said output terminal, and a gate connected to said fourth node;

a second-channel-conductivity type MOS transistor having a source connected to said second power supply terminal, a drain connected to a sixth node, and a gate connected to said fourth node; and a second-channel-conductivity type MOS transistor having a source connected to said sixth node, a drain connected to said output terminal, and a gate connected to said control terminal.

17. A multiplexor claimed in claim 1 further including a first data input terminal, a second data input terminal, a control terminal for receiving said control signal, a first power supply terminal, a second power supply terminal, and an output terminal, and wherein said first latch includes a first-channel-conductivity type MOS transistor having a source connected to said first power supply terminal, a drain connected to a second node, and a gate connected to said control terminal;

a first-channel-conductivity type MOS transistor having a source connected to said second node, a drain connected to a first node, and a gate connected to said first data input terminal;

a second-channel-conductivity type MOS transistor having a source connected to said second power supply terminal, a drain connected to said first node, and a gate connected to said control terminal;

a first-channel-conductivity type MOS transistor having a source connected to said first power supply terminal, a drain connected to a third node, and a gate connected to said first node;

a first-channel-conductivity type MOS transistor having a source connected to said third node, a drain connected to said output terminal, and a gate connected to said control terminal; and a second-channel-conductivity type MOS transistor having a source connected to said second power supply terminal, a drain connected to said output terminal, and a gate connected to said first node; and wherein said second latch includes a first-channel-conductivity type MOS transistor having a source connected to said first power supply terminal, a drain connected to a fourth node, and a gate connected to said control terminal;

a second-channel-conductivity type MOS transistor having a source connected to said second power supply terminal, a drain connected to a fifth node, and a gate connected to said control terminal;

a second-channel-conductivity type MOS transistor having a source connected to said fifth node, a drain connected to said fourth node, and a gate connected to said second data input terminal;

a first-channel-conductivity type MOS transistor having a source connected to said first power supply terminal, a drain connected to said output terminal, and a gate connected to said fourth node;

a second-channel-conductivity type MOS transistor having a source connected to said fifth node, a drain connected to a sixth node, and a gate connected to said fourth node; and a second-channel-conductivity type MOS transistor having a source connected to said sixth node, a drain connected to said output terminal, and a gate connected to said control terminal.

* * * * *